(12) United States Patent
Noma

(10) Patent No.: US 9,190,361 B2
(45) Date of Patent: Nov. 17, 2015

(54) SEMICONDUCTOR DEVICE AND METHOD OF MANUFACTURING THE SAME

(71) Applicant: KABUSHIKI KAISHA TOSHIBA, Minato-ku, Tokyo (JP)

(72) Inventor: Kenji Noma, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/166,703

(22) Filed: Jan. 28, 2014

(65) Prior Publication Data

US 2015/0069545 A1    Mar. 12, 2015

(30) Foreign Application Priority Data

Sep. 9, 2013   (JP) ................................. 2013-186599

(51) Int. Cl.
| | |
|---|---|
| *H01L 23/552* | (2006.01) |
| *H01L 43/02* | (2006.01) |
| *H01L 43/12* | (2006.01) |
| *H01L 23/00* | (2006.01) |

(52) U.S. Cl.
CPC .............. *H01L 23/552* (2013.01); *H01L 24/97* (2013.01); *H01L 43/02* (2013.01); *H01L 43/12* (2013.01); *H01L 2224/04042* (2013.01); *H01L 2224/16225* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/49175* (2013.01); *H01L 2224/73265* (2013.01); *H01L 2224/97* (2013.01); *H01L 2924/15153* (2013.01); *H01L 2924/15311* (2013.01); *H01L 2924/167* (2013.01); *H01L 2924/16195* (2013.01); *H01L 2924/16251* (2013.01)

(58) Field of Classification Search
CPC ....... G11C 11/16; H01L 27/228; H01L 43/08
USPC ......................................................... 257/421
See application file for complete search history.

(56) References Cited

U.S. PATENT DOCUMENTS

| | | | |
|---|---|---|---|
| 6,664,624 B2 | 12/2003 | Haematsu | |
| 7,009,818 B1 * | 3/2006 | Arnold et al. | ................. 360/320 |

(Continued)

FOREIGN PATENT DOCUMENTS

| | | |
|---|---|---|
| JP | 02005018 B | 1/1990 |
| JP | 05074771 A | 3/1993 |

(Continued)

OTHER PUBLICATIONS

U.S. Appl. No. 14/140,393, Title: "Semiconductor Device and Method of Manufacturing the Same", First Named Inventor: Takeshi Fujimori, Filed: Dec. 24, 2013.

*Primary Examiner* — Zandra Smith
*Assistant Examiner* — Lawrence Tynes, Jr.
(74) *Attorney, Agent, or Firm* — Holtz, Holtz, Goodman & Chick PC

(57) ABSTRACT

According to one embodiment, a semiconductor device includes a MRAM chip including a semiconductor substrate and a memory cell array area includes magnetoresistive elements which are provided on the semiconductor substrate, and a magnetic shield layer separated from the MRAM chip, surrounding the memory cell array area in a circumferential direction of the MRAM chip, and having a closed magnetic path.

21 Claims, 23 Drawing Sheets

(56) References Cited

U.S. PATENT DOCUMENTS

| | | |
|---|---|---|
| 8,258,604 B2 | 9/2012 | Bando et al. |
| 2002/0145902 A1 | 10/2002 | Kunikiyo et al. |
| 2004/0048463 A1 | 3/2004 | Haematsu |
| 2005/0230788 A1 | 10/2005 | Kato et al. |
| 2006/0108668 A1 | 5/2006 | Knudsen |
| 2006/0289970 A1* | 12/2006 | Gogl et al. .................. 257/659 |
| 2009/0045488 A1* | 2/2009 | Chang et al. ................. 257/659 |
| 2009/0122597 A1 | 5/2009 | Sugibayashi et al. |
| 2012/0211846 A1* | 8/2012 | Li et al. ...................... 257/421 |
| 2012/0293170 A1* | 11/2012 | Nakajima et al. ............ 324/252 |
| 2012/0309131 A1 | 12/2012 | Bando et al. |
| 2015/0008547 A1* | 1/2015 | Pi et al. ...................... 257/421 |

FOREIGN PATENT DOCUMENTS

| | | |
|---|---|---|
| JP | 06267962 A | 9/1994 |
| JP | 2004064016 A | 2/2004 |
| JP | 2010-123666 A | 6/2010 |
| JP | 2011-114211 A | 6/2011 |

* cited by examiner

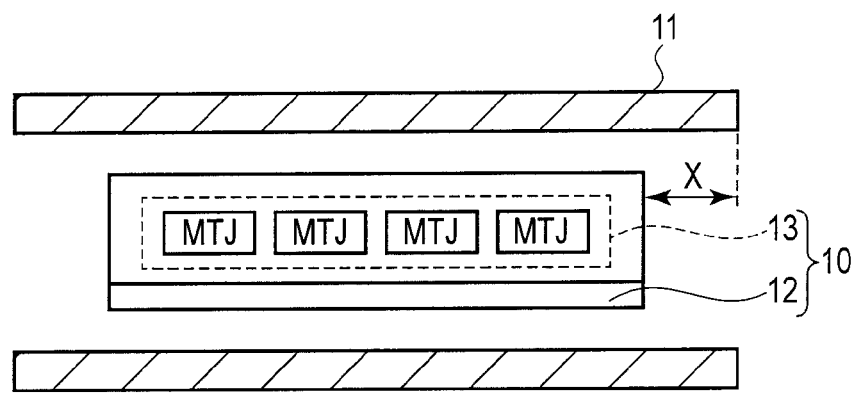
F I G. 6
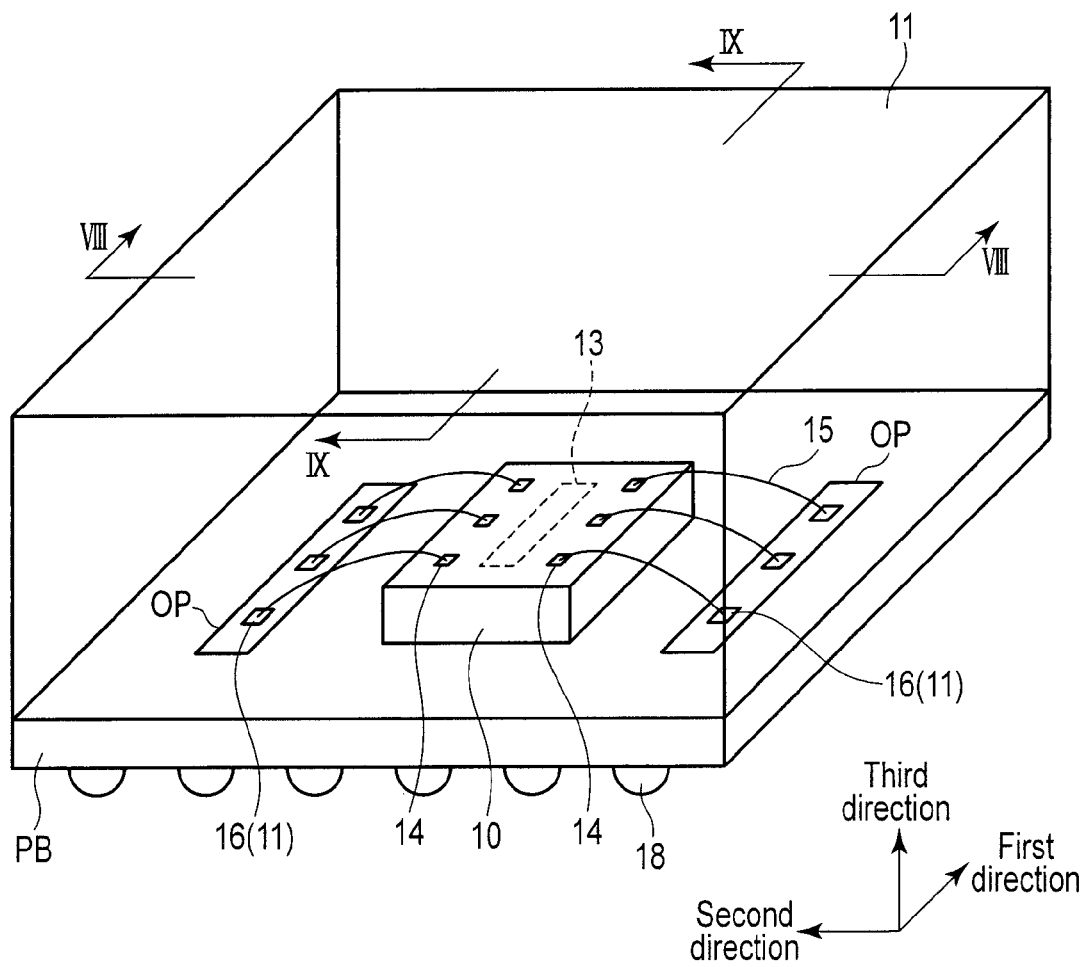
F I G. 7

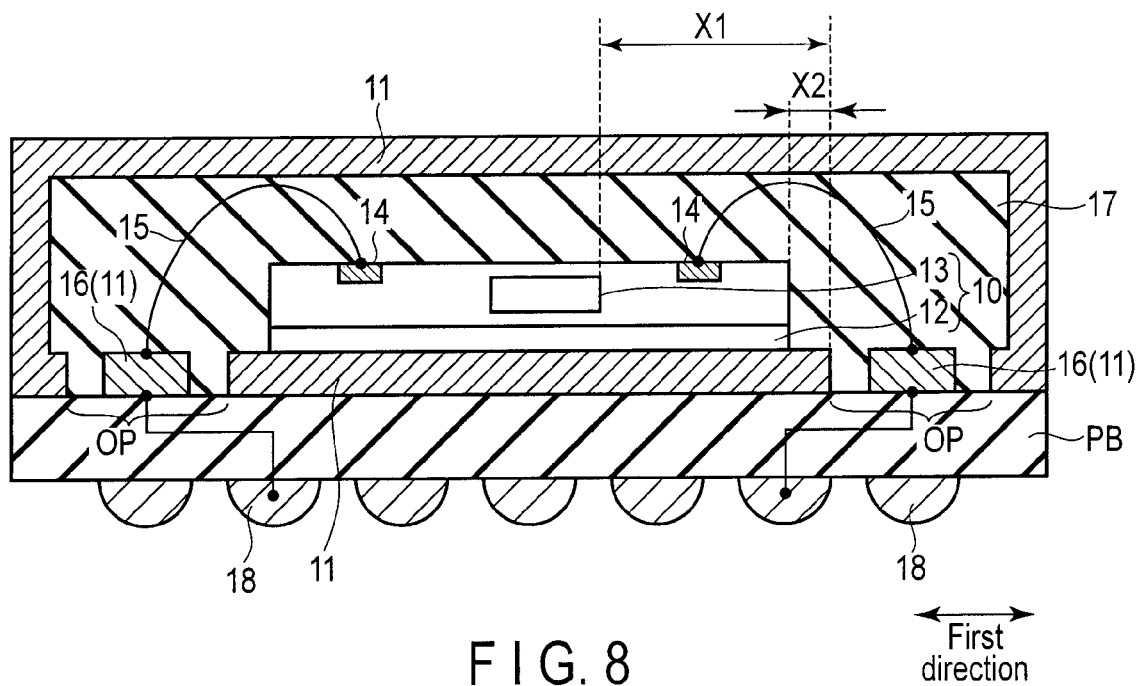
F I G. 8
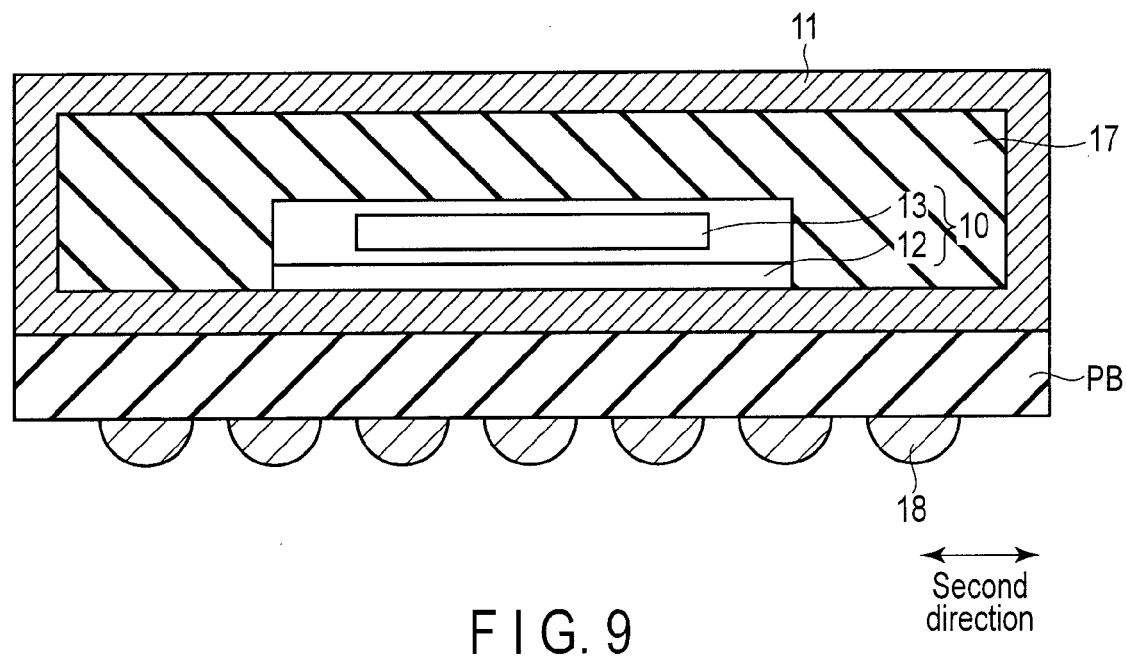
F I G. 9

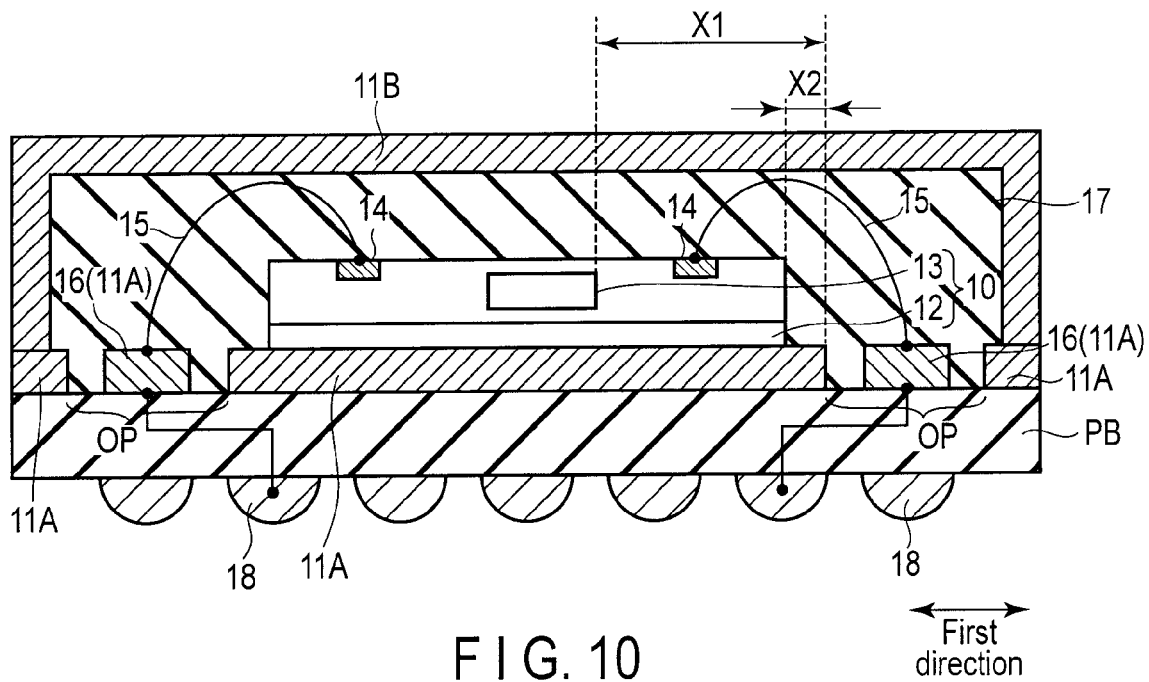
F I G. 10
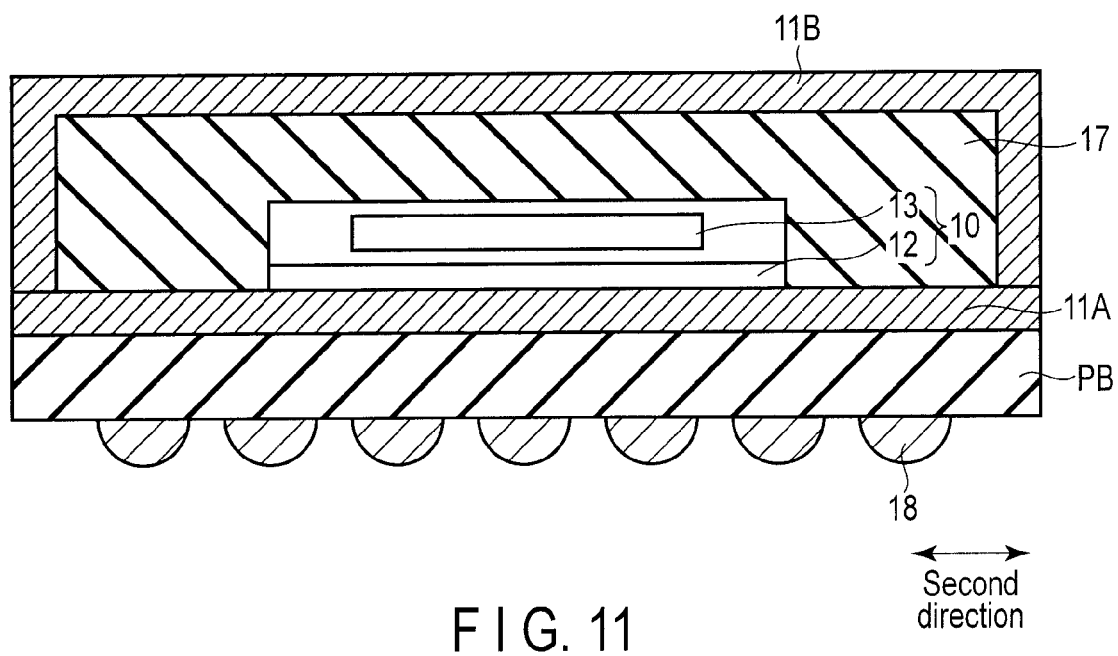
F I G. 11

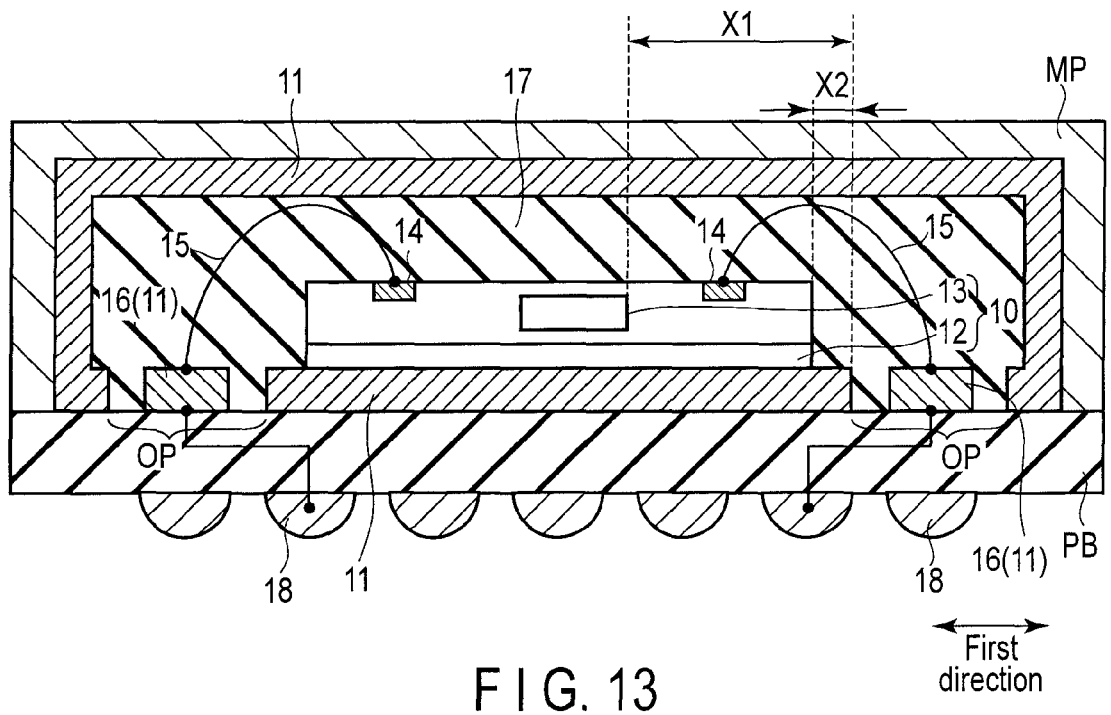
F I G. 13
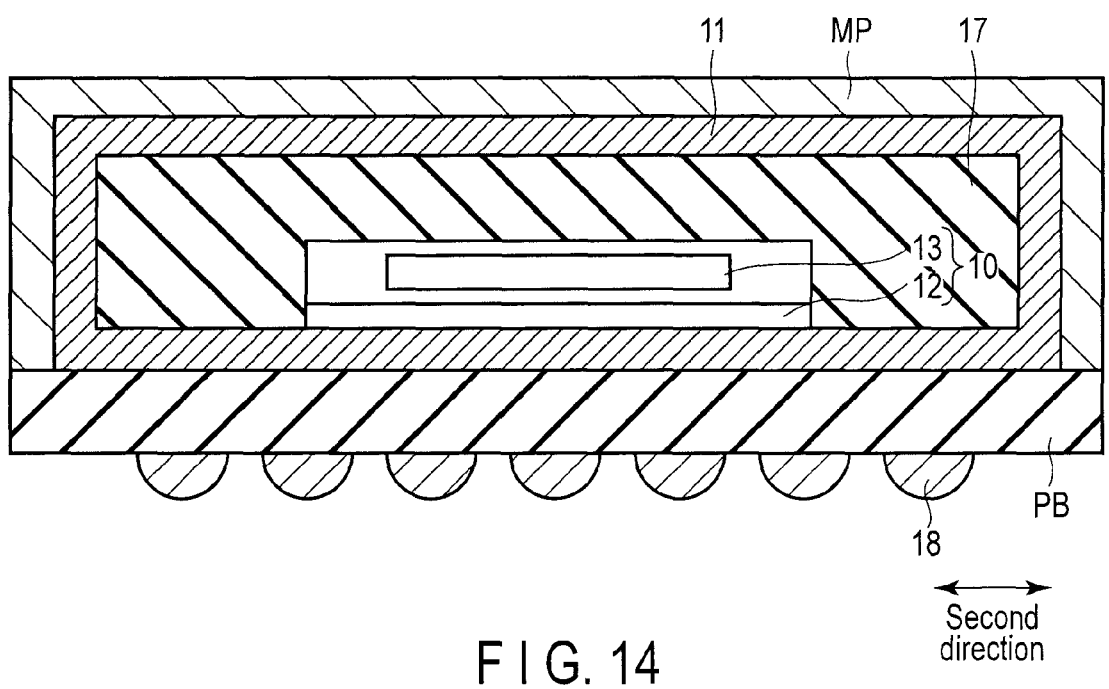
F I G. 14

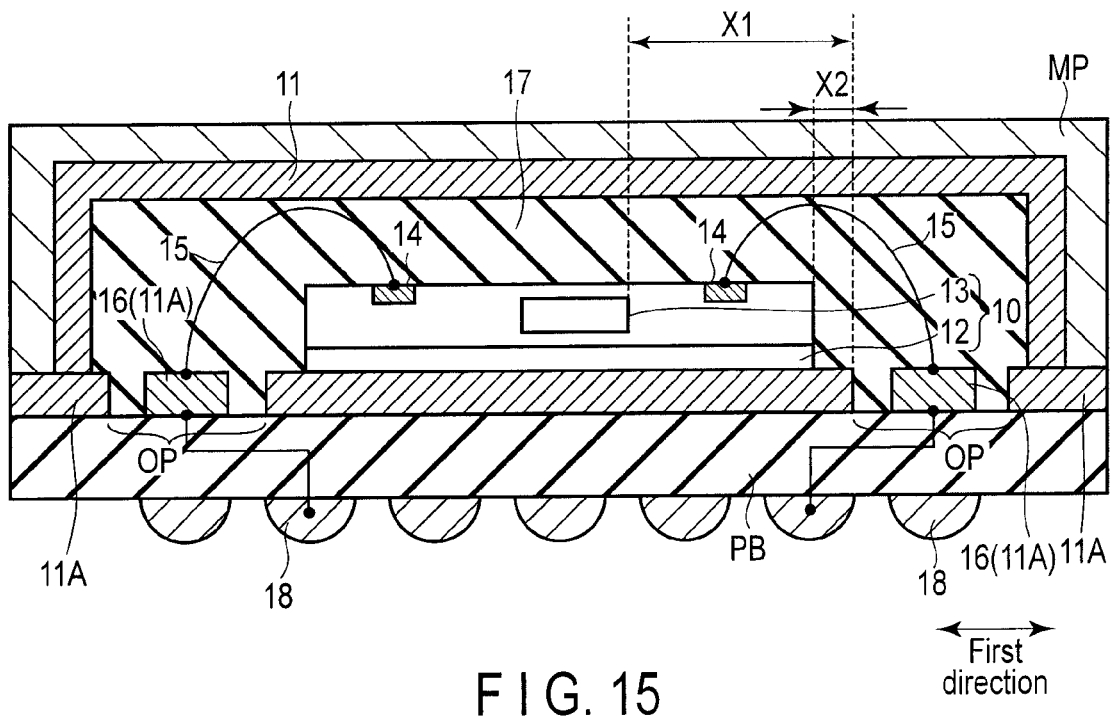
F I G. 15
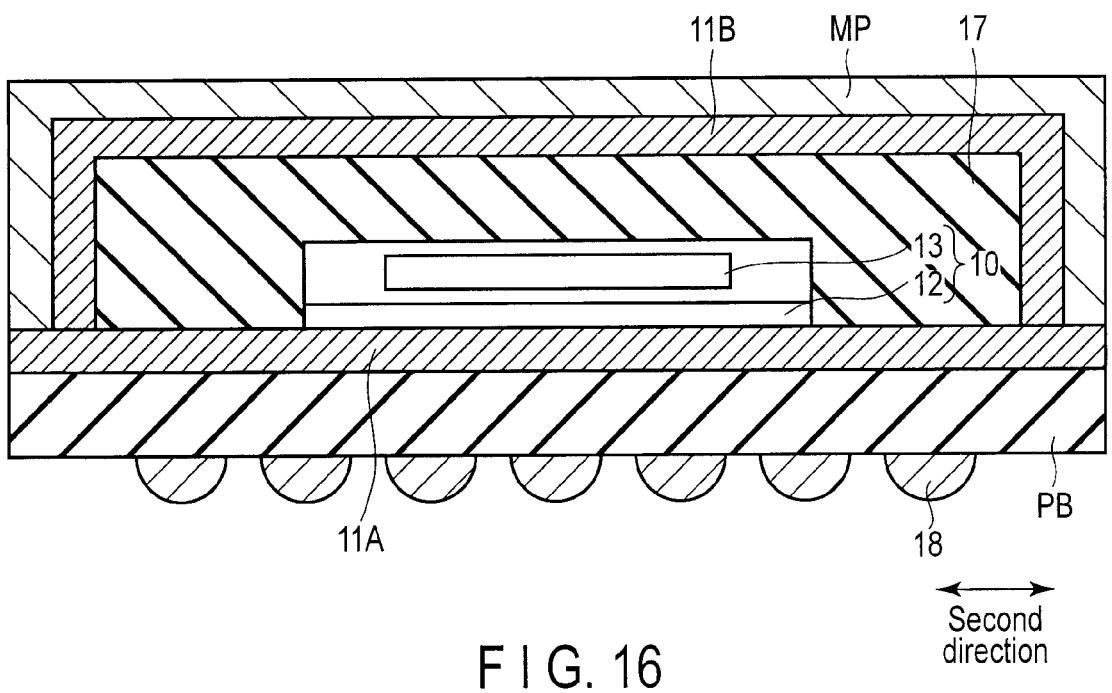
F I G. 16

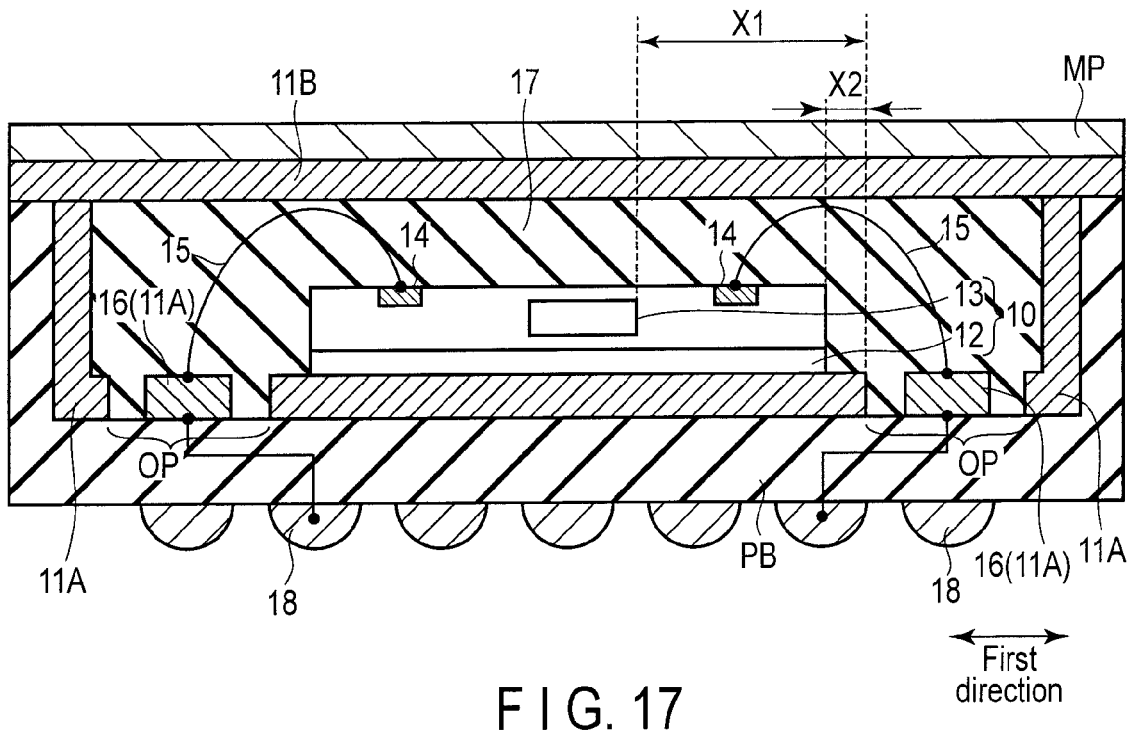
F I G. 17
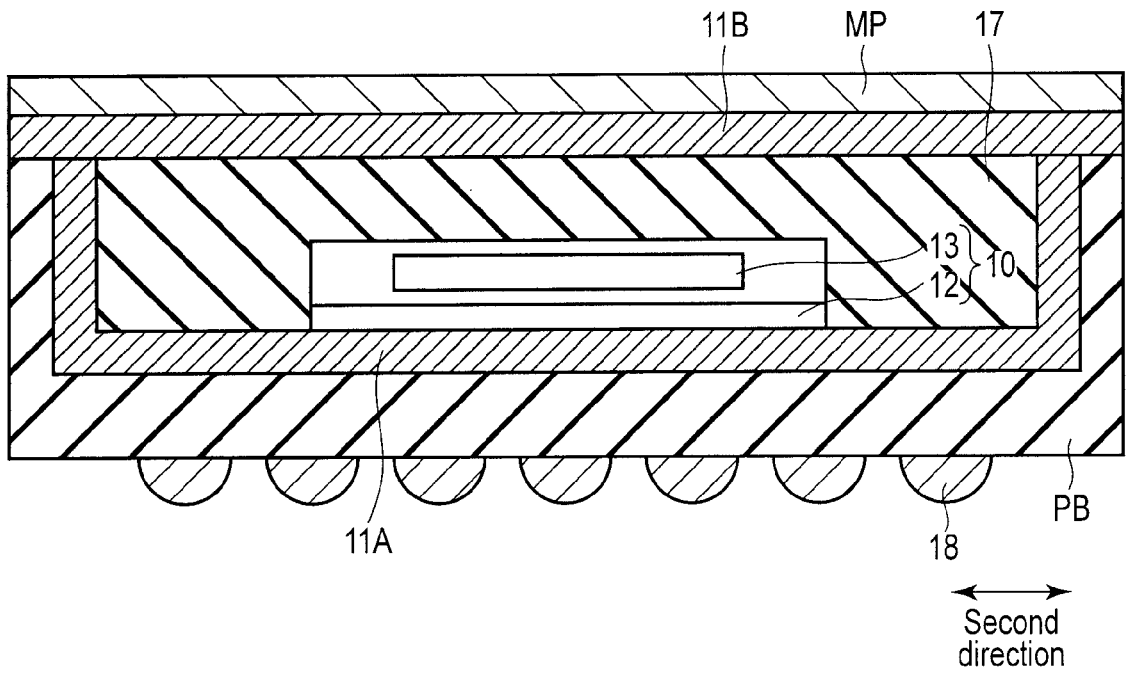
F I G. 18

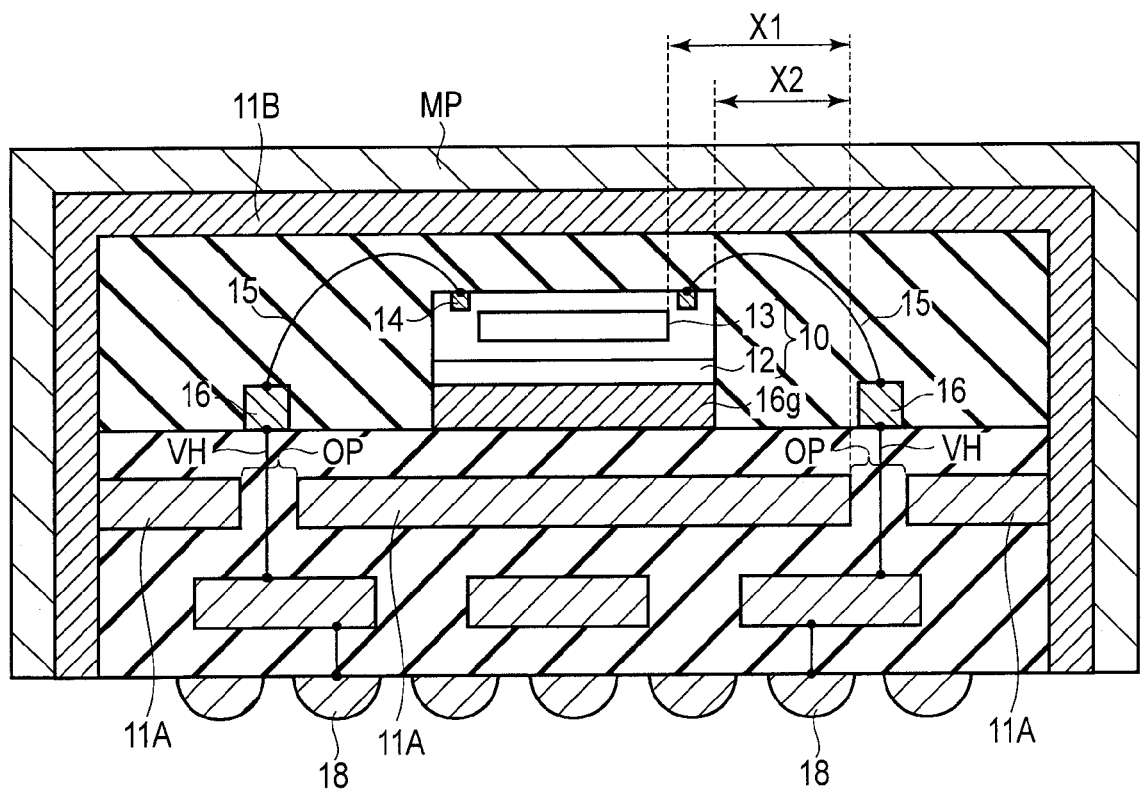
F I G. 26

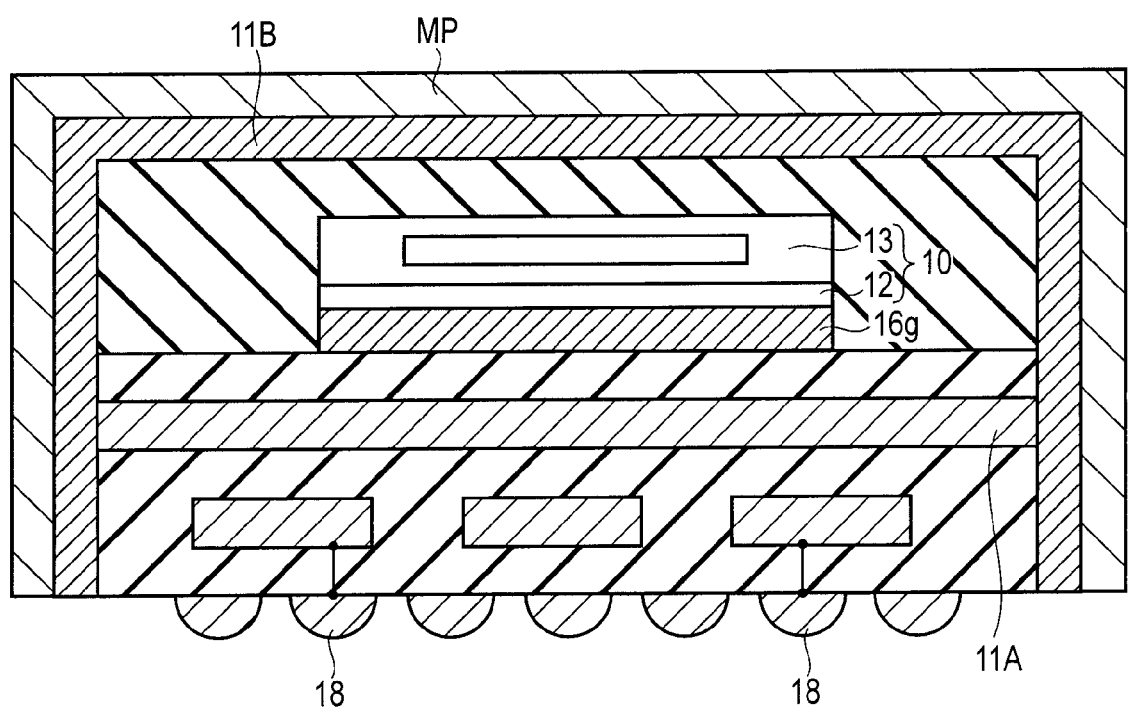
F I G. 27

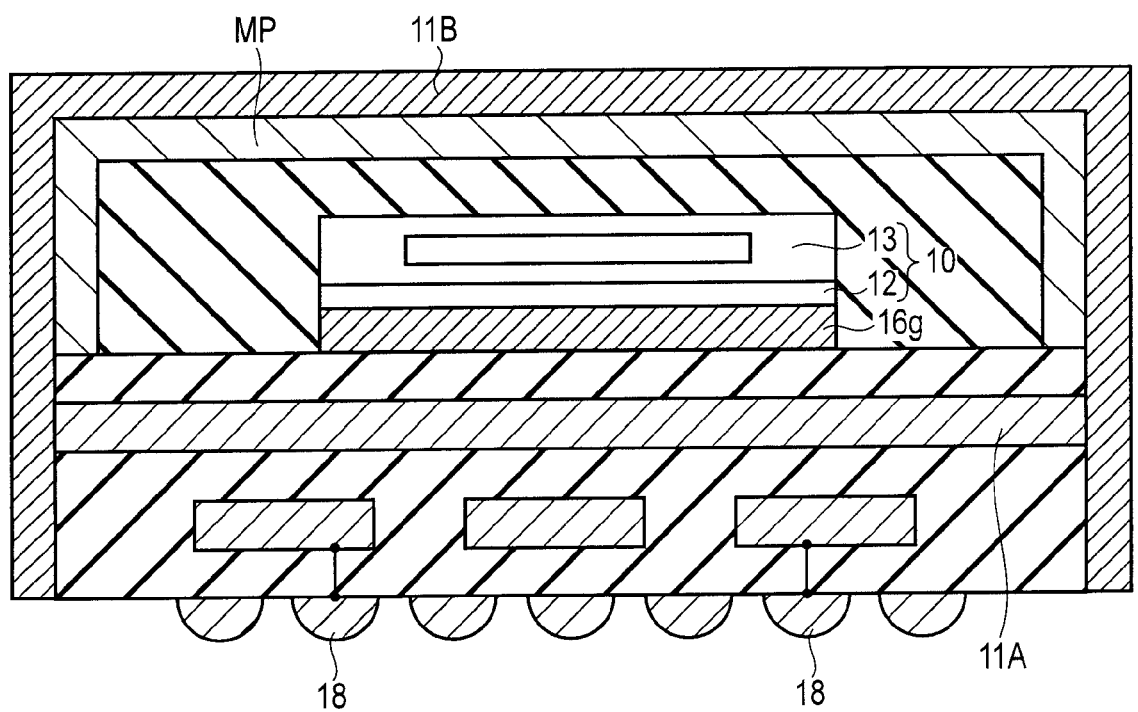
F I G. 29

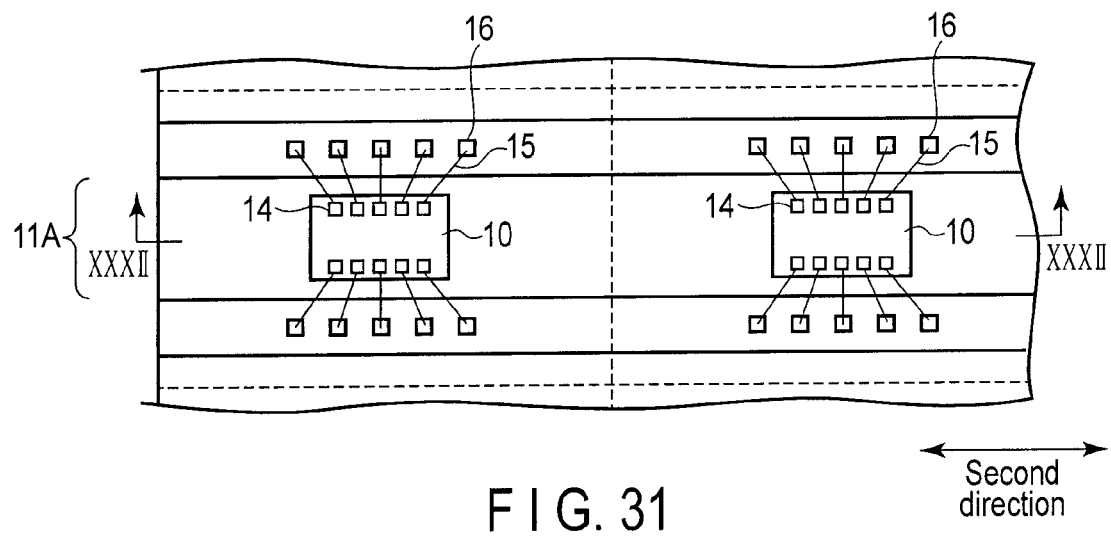
F I G. 31
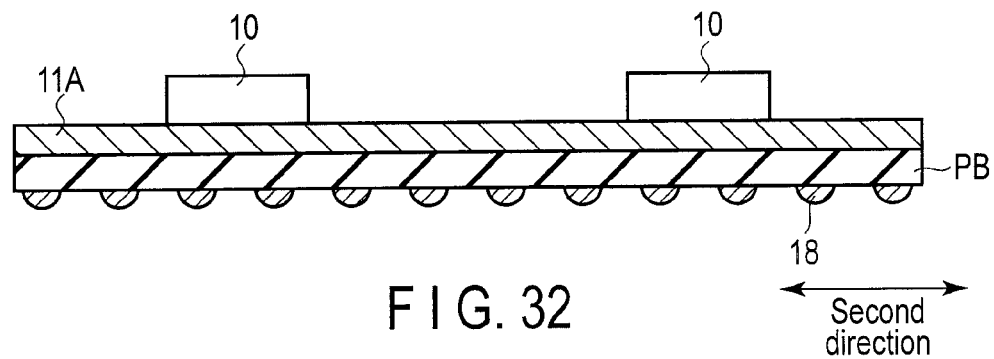
F I G. 32
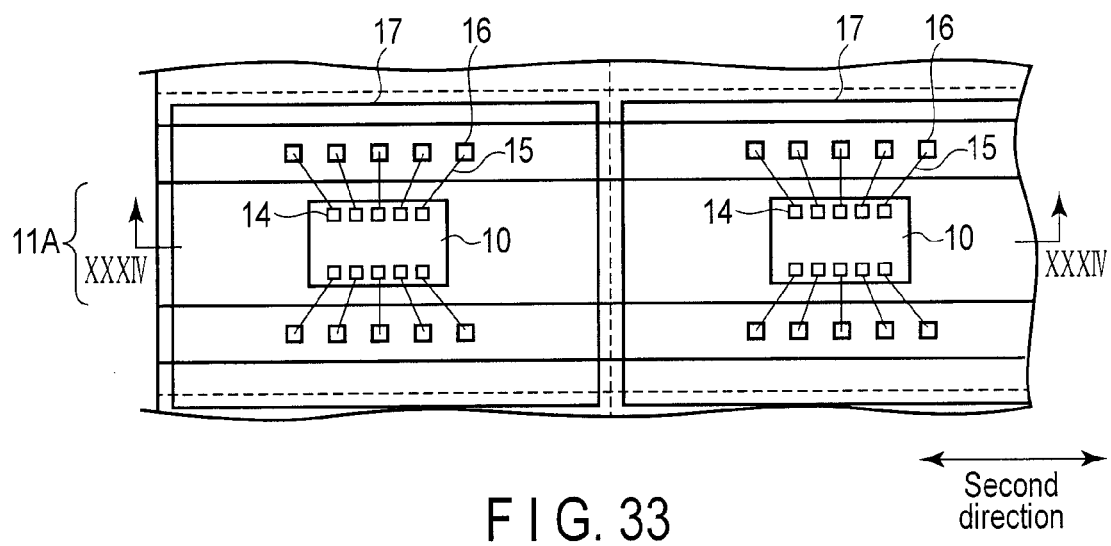
F I G. 33

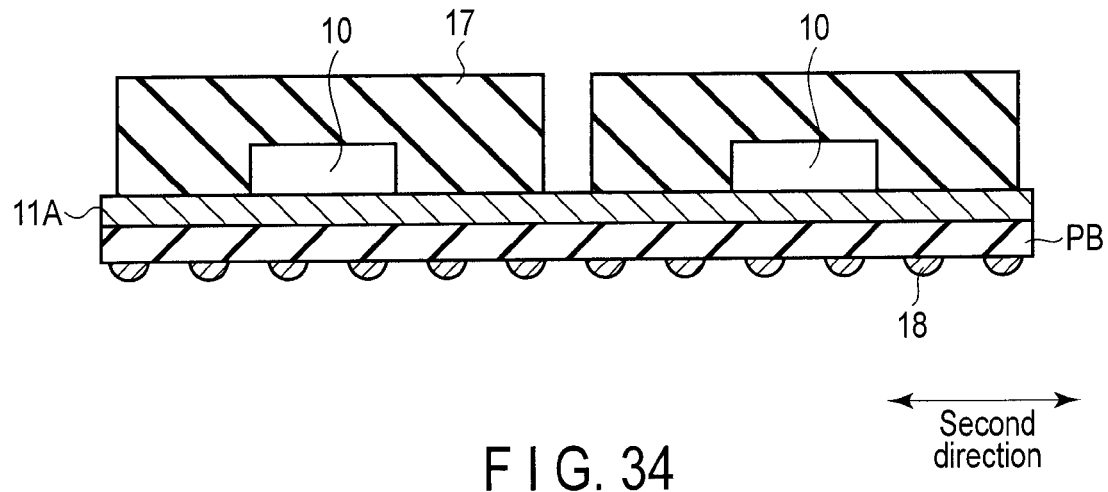
F I G. 34
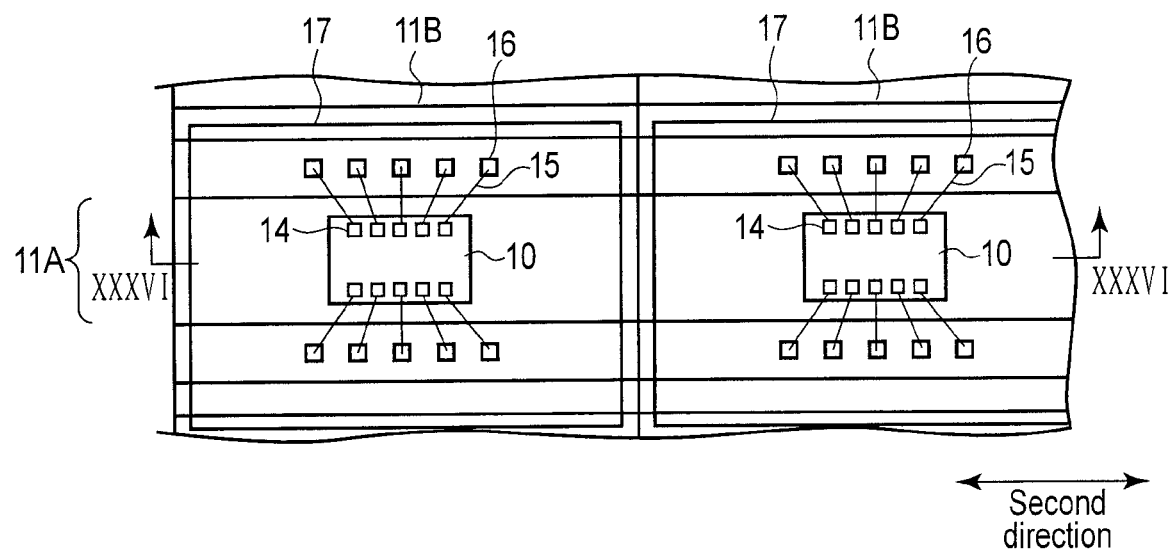
F I G. 35

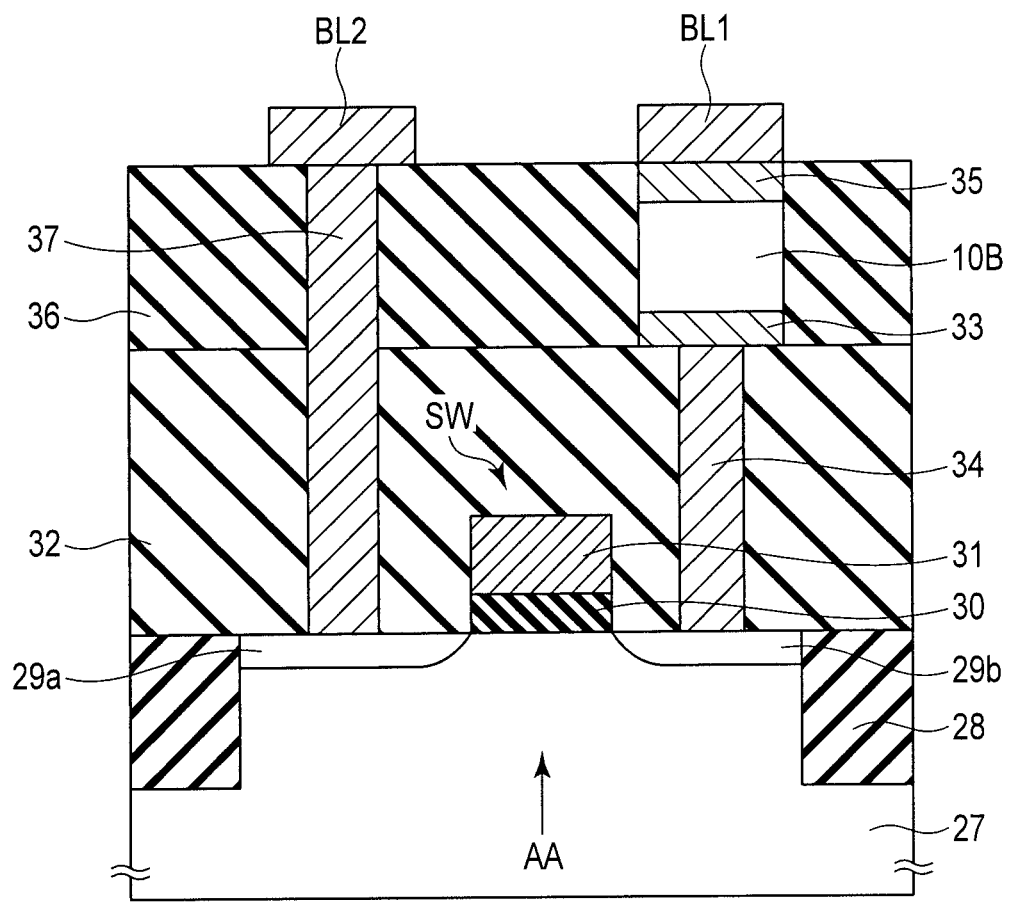
F I G. 39

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2013-186599, filed Sep. 9, 2013, the entire contents of which are incorporated herein by reference.

FIELD

Embodiments described herein relate generally to a semiconductor device and a method of manufacturing the same.

BACKGROUND

A magnetic random access memory (MRAM) chip used as a nonvolatile semiconductor memory device controls operations, such as writing, reading and data storage, utilizing magnetization of a magnetoresistive element. Accordingly, if the magnetization of the magnetoresistive element is influenced by an external magnetic field passing through the MRAM chip, the operations may well vary. In view of this, it is desirable to block the external magnetic field using a magnetic shield layer so that the external magnetic field does not enter the MEAN chip.

BRIEF DESCRIPTION OF THE DRAWINGS

FIG. 6 is a cross-sectional view taken along line VI-VI of FIG. 4;
FIG. 7 is a perspective view of a third embodiment;
FIG. 8 is a cross-sectional view taken along line VIII-VIII of FIG. 7;
FIG. 9 is a cross-sectional view taken along line IX-IX of FIG. 7;
FIGS. 10 and 11 are cross-sectional views of a modification example of the third embodiment;
FIG. 13 is a cross-sectional view taken along line XIII-XIII of FIG. 12;
FIG. 14 is a cross-sectional view taken along line XIV-XIV of FIG. 12;
FIGS. 15 and 16 are cross-sectional views of a first modification example of the fourth embodiment;
FIGS. 17 and 18 are cross-sectional views of a second modification example of the fourth embodiment;
FIG. 26 is a cross-sectional view taken along line XXVI-XXVI of FIGS. 23, 24 and 25;
FIG. 27 is a cross-sectional view taken along line XXVII-XXVII of FIGS. 23, 24 and 25;
FIGS. 28 and 29 are cross-sectional views of a seventh embodiment;
FIG. 31 is a plan view of the embodiment of the manufacturing method;
FIG. 32 is a cross-sectional view taken along line XXXII-XXXII of FIG. 31;
FIG. 33 is a plan view of the embodiment of the manufacturing method;
FIG. 34 is a cross-sectional view taken along line XXXIV-XXXIV of FIG. 33;
FIG. 35 is a plan view of the embodiment of the manufacturing method;
FIG. 39 is a cross-sectional view of a memory cell example.

DETAILED DESCRIPTION

In general, according to one embodiment, a semiconductor device comprises: a MRAM chip including a semiconductor substrate and a memory cell array area comprising magnetoresistive elements which are provided on the semiconductor substrate; and a magnetic shield layer separated from the MRAM chip, surrounding the memory cell array area in a circumferential direction of the MRAM chip, and having a closed magnetic path.

(First Embodiment)

Figure 1:
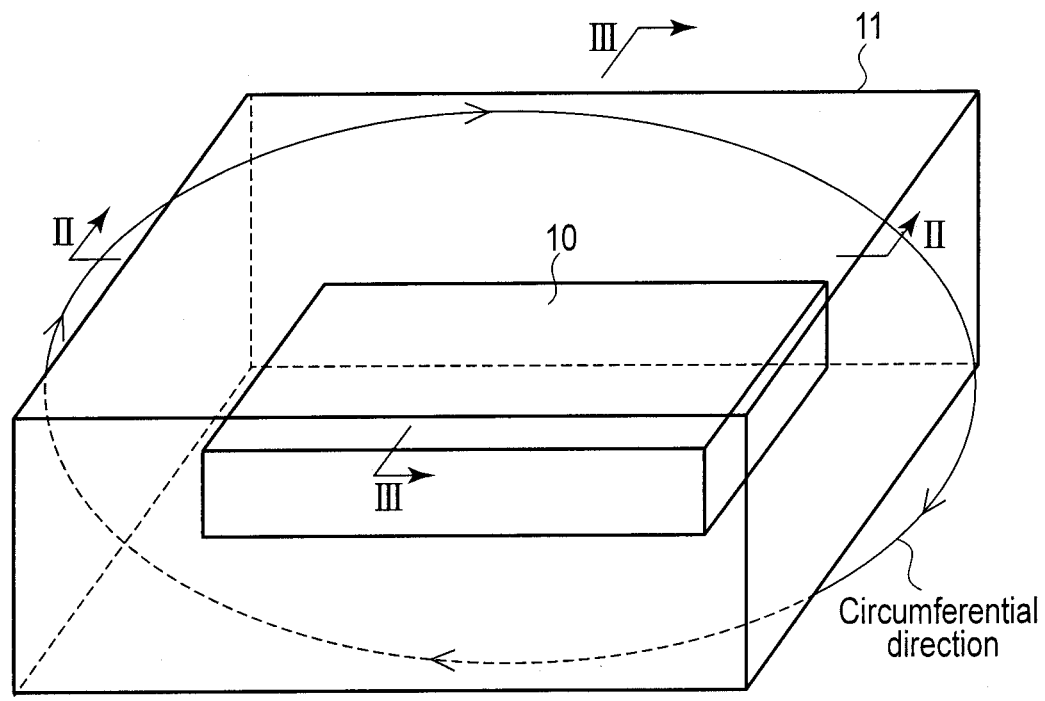
FIG. 1 is a perspective view showing a first embodiment.
Figure 2:
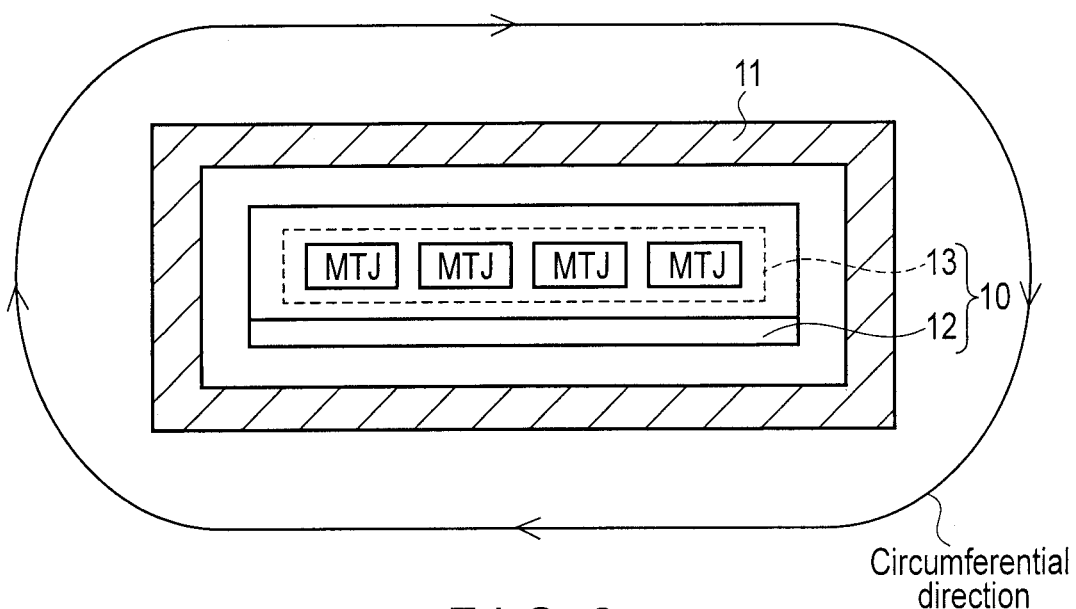
FIG. 2 is a cross-sectional view taken along line II-II of FIG. 1.
Figure 3:
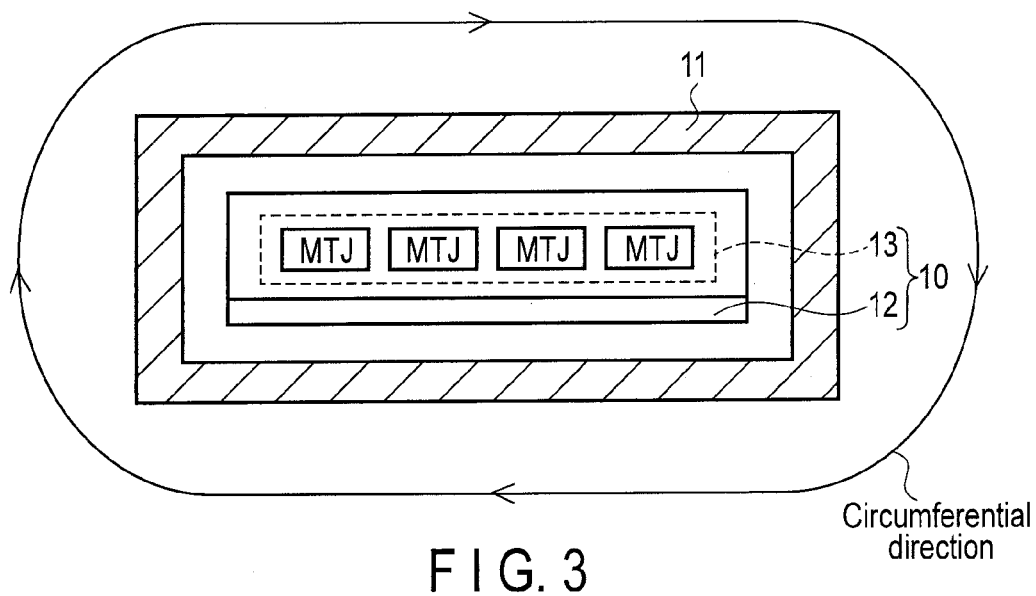
FIG. 3 is a cross-sectional view taken along line of FIG. 1.

FIG. 1 is a perspective view showing a first embodiment. FIG. 2 is a cross-sectional view taken along line II-II of FIG. 1. FIG. 3 is a cross-sectional view taken along line of FIG. 1.

A semiconductor device according to the first embodiment comprises an MRAM chip 10 having a memory cell array area 13, and a magnetic shield layer 11 separated from the MRAM chip 10, circumferentially surrounding the memory cell array area 13 of the MRAM chip 10, and providing a closed magnetic path. The MRAM chip 10 comprises a semiconductor substrate 12, on which the memory cell array area 13 is provided.

The memory cell array area 13 comprises a plurality of memory cells. Each memory cell comprises a magnetoresistive element MTJ. For instance, one memory cell comprises one magnetoresistive element MTJ. Further, one memory cell may include a diode (in the case of a cross point type memory cell array area), a selective transistor (in the case of a one transistor—one magnetoresistive element type memory cell array), etc.

The magnetoresistive element MTJ is an element configured to store data utilizing a magnetoresistive effect. The basic structure of the magnetoresistive element MTJ comprises a reference layer having a constant magnetism, a memory layer having a variable magnetism, and a tunnel barrier layer between the reference layer and the memory layer.

The magnetoresistive element MTJ can assume a parallel state in which the residual magnetization direction of the memory layer is the same as that of the reference layer, or an anti-parallel state in which the residual magnetization direction of the memory layer is opposite to that of the reference layer.

For instance, the magnetoresistive element MTJ has a low resistance in the parallel state, and has a high resistance in the anti-parallel state. Namely, the magnetoresistive element MTJ can store the difference between these resistances as binary data.

In order to accurately write data to the magnetoresistive element MTJ, to accurately read data from the magnetoresistive element MTJ, and to store data in the magnetoresistive element MTJ for a long time, it is important to block external magnetic fields that will influence the magnetization of the magnetoresistive element MTJ.

In the above-mentioned structure, the magnetic shield layer 11 circumferentially surrounds the memory cell array area 13 of the MRAM chip 10. Namely, the magnetic shield layer 11 has a closed loop structure in a first cross section (see FIG. 2) that is perpendicular to the major surface of the semiconductor substrate 12 and is parallel to a circumferential direction. Accordingly, the magnetic shield layer 11 can prevent external magnetic fields from entering the MRAM chip 10.

As a result, the operations (writing, reading and data storage) of the MRAM chip 10 can be accurately performed without the influence of the external magnetic fields.

It is desirable that the magnetic shield layer 11 have a high magnetic permeability and a high saturated magnetization.

Materials for realizing this are, for example, Ni, Fe, Co, an Ni—Fe alloy, an Fe—Co alloy, and Fe2O4 containing Mn, Ni or Zn.

It is also desirable that the magnetic shield layer 11 have a thickness of 100 nm or more and 100 μm or less.

The magnetoresistive element MTJ is of a perpendicular magnetization type in which the element has magnetization perpendicular to the major surface of the semiconductor substrate 12, or of an in-plane magnetization type in which the element has magnetization parallel to the major surface of the semiconductor substrate 12.

The perpendicular magnetization type magnetoresistive element MTJ is easily influenced by an external magnetic field of the same magnetization direction as that of the memory layer, i.e., by an external magnetic field of a magnetization direction perpendicular to the major surface of the semiconductor substrate 12. Since, however, this external magnetic field is prevented from entering the MRAM chip 10 by the closed magnetic path of the magnetic shield layer 11, it does not influence the magnetization of the magnetoresistive elements MTJ in the memory cell array area 13.

On the other hand, the in-plane magnetization type magnetoresistive element MTJ is easily influenced by an external magnetic field of the same magnetization direction as that of the memory layer, i.e., by an external magnetic field of a magnetization direction parallel to the major surface of the semiconductor substrate 12. Since, however, this external magnetic field is prevented from entering the MRAM chip 10 by the magnetic shield layer 11 located on the upper and lower surfaces of the MRAM chip 10, it does not influence the magnetization of the magnetoresistive elements MTJ in the memory cell array area 13.

As described above, the semiconductor device of the first embodiment prevents external magnetic fields from entering the MRAM chip 10 to thereby stabilize the operations of the MRAM chip 10.

(Second Embodiment)

Figure 4:
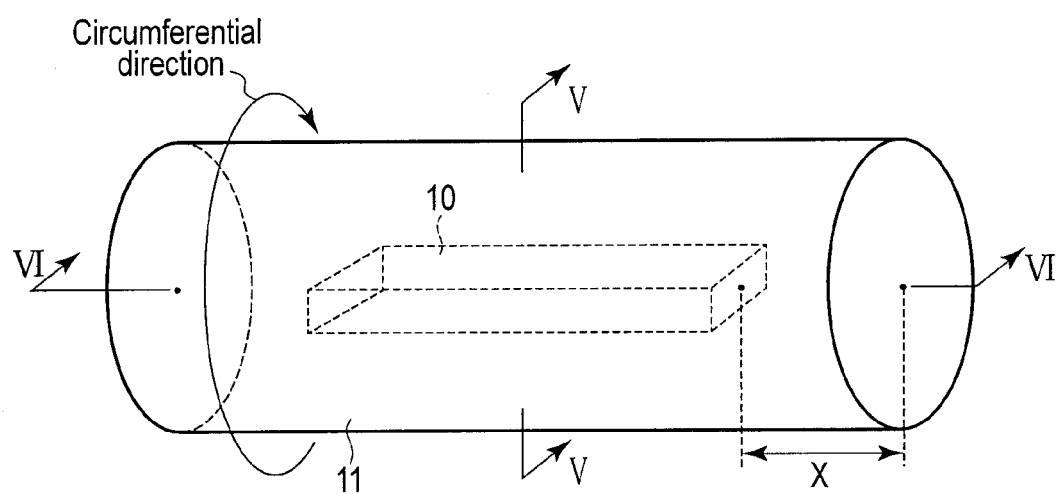
FIG. 4 is a perspective view showing a second embodiment.
Figure 5:
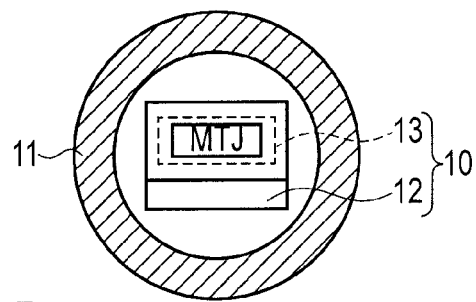
FIG. 5 is a cross-sectional view taken along line V-V of FIG. 4.

FIG. 4 is a perspective view showing a second embodiment. FIG. 5 is a cross-sectional view taken along line V-V of FIG. 4. FIG. 6 is a cross-sectional view taken along line VI-VI of FIG. 4.

The semiconductor device of the second embodiment comprises an MRAM chip 10 having a memory cell array area 13, and a magnetic shield layer 11 separated from the MRAM chip 10, circumferentially surrounding the memory cell array area 13 of the MRAM chip 10, and providing a closed magnetic path. The MRAM chip 10 comprises a semiconductor substrate 12, on which the memory cell array area 13 is provided.

The magnetic shield layer 11 has a closed loop structure in a first cross section (see FIG. 5) that is perpendicular to the major surface of the semiconductor substrate 12 and is parallel to a circumferential direction. Accordingly, the magnetic shield layer 11 can prevent external magnetic fields from entering the MRAM chip 10.

Further, the magnetic shield layer 11 has ends in a second cross section (see FIG. 6) perpendicular to the first cross section and parallel to the major surface of the semiconductor substrate 12. It is desirable to set the distance X between each end of the layer 11 and the MRAM chip 10 as long as possible.

The magnetoresistive elements MTJ employed in the second embodiment are similar to those of the first embodiment, and therefore will not be described. The relationship between the magnetoresistive element MTJ type (perpendicular magnetization/in-plane magnetization) and the external magnetic field is also similar to that in the first embodiment, and therefore will not be described.

By virtue of the above-described structure of the second embodiment, external magnetic fields can be prevented by the magnetic shield layer 11 from entering the MRAM chip 10. As a result, the operations (writing, reading and data storage) of the MRAM chip 10 can be reliably performed without the influence of the external magnetic fields.

(Third Embodiment)

FIG. 7 is a perspective view of a third embodiment. FIG. 8 is a cross-sectional view taken along line VIII-VIII of FIG. 7. FIG. 9 is a cross-sectional view taken along line IX-IX of FIG. 7.

A semiconductor device according to the third embodiment comprises a printed board (e.g., an epoxy board) PB, an MRAM chip 10 provided on the circuit board PB and having a memory cell array area 13, a magnetic shield layer 11 separated from the MRAM chip 10, circumferentially surrounding the memory cell array area 13 of the MRAM chip 10, and having a closed magnetic path, and a sealing member (formed of, for example, a resin) 17 covering the MRAM chip 10.

The MRAM chip 10 comprises a semiconductor substrate 12, and the memory cell array area 13 is located on the semiconductor substrate 12. The MRAM 10 also comprises pads 14. For instance, the pads 14 are connected to external terminals (e.g., solder balls) 18, provided on the reverse surface of the printed board PB, via bonding wires 15 and conductive lines 16 on the printed board PB.

The semiconductor device of the third embodiment is characterized in that the MRAM chip 10 is packaged by the sealing member 17, that the magnetic shield layer 11 is provided between the printed board PB and a lower surface of the MRAM chip 11, and that the magnetic shield layer 11 is provided on the sealing member 17 in state of covering an upper surface and a side surface of the MRAM chip 10.

To prevent external magnetic fields from entering the MRAM chip, it is desirable that the magnetic shield layer 11 completely covers the MRAM chip 10 as shown in FIGS. 1 to 3. However, in general, the printed board PB has a conductive line 16 electrically connected to the MRAM chip 10. In this case, it is necessary that the magnetic shield layer 11 on the printed board PB has an opening OP in an area in that the conductive line 16 is provided.

In view of preventing erroneous operations of the MRAM chip 10 due to external magnetic fields, it is sufficient if the magnetic shield layer 11 at least circumferentially surrounds the memory cell array area 13. This is because erroneous operations may well be caused by the influence of the external magnetic fields on the magnetization of the magnetoresistive elements MTJ in the memory cell array area 13.

In view of the above, in the third embodiment, based on the structures shown in FIGS. 4 to 6, the magnetic shield layer 11 circumferentially surrounds at least the memory cell array area 13. Namely, the opening OP of the magnetic shield layer 11 is located outside an end portion of the MRAM chip 10.

In this case, the magnetic shield layer 11 has a closed loop structure in a first cross section (see FIG. 9) perpendicular to the major surface of the semiconductor substrate 12 and parallel to a circumferential direction. Accordingly, the magnetic shield layer 11 can prevent external magnetic fields from entering the memory cell array area 13 of the MRAM chip 10.

Further, the magnetic shield layer 11 has an end in a second cross section (see FIG. 8) perpendicular to the first cross section and parallel to the major surface of the semiconductor substrate 12. It is desirable to set, as long as possible, the distance X1 between this end and the memory cell array area 13, and the distance X2 between this end and the MRAM chip 10.

FIGS. 10 and 11 show a modification of the third embodiment (shown in FIGS. 7 to 9).

FIGS. 10 and 11 correspond to FIGS. 8 and 9, respectively.

This modification is characterized in that the magnetic shield layer comprises a first magnetic layer 11A covering the lower surface of the MRAM chip 10, and a second magnetic layer 11B covering the upper and side surfaces of the MRAM chip 10.

The first magnetic layer 11A is provided on the printed board PB and has openings OP. The second magnetic layer 11B is provided on the sealing member 17. The first and second magnetic layers 11A and 11B may be formed of the same material or different materials.

This modification is similar to the third embodiment in the other points.

Further, the magnetoresistive element MTJ of the modification is similar to that of the first embodiment, and therefore will not be described. Similarly, the relationship between the magnetoresistive element MTJ type (perpendicular magnetization/in-plane magnetization) and the external magnetic field is the same as that in the first embodiment, and therefore will not be described.

Although it is assumed in the modification that the sealing member 17 is a resin member, a metal cap may be employed instead. Further, although it is assumed in the modification that the external terminals 18 of the package are solder balls, conductive pins (metal pillars) may be employed instead.

Also, in the modification, no sealing members may be employed. In this case, the magnetic shield layer 17 covering the upper and side surfaces of the MRAM chip 10 functions as a package.

In addition, in the modification, the conductive lines 16 on the printed board PB may be made to also function as shielding members instead of the magnetic shield layer 11. Namely, since the magnetic shield layer 11 is a conductive layer, part of the layer 11 can be used as a conductive line 11.

In this case, the conductive lines 16 on the printed board PB and the first magnetic layer 11A can be simultaneously formed in the same step, which contributes to manufacturing cost reduction.

In the third embodiment, external magnetic fields can be blocked by the magnetic shield layer 11 so as not to enter the memory cell array area 13 of the MRAM chip 10. As a result, the operations (writing, reading and data storage) of the MRAM chip 10 can be reliably performed without the influence of the external magnetic fields.

(Fourth Embodiment)

Figure 12:
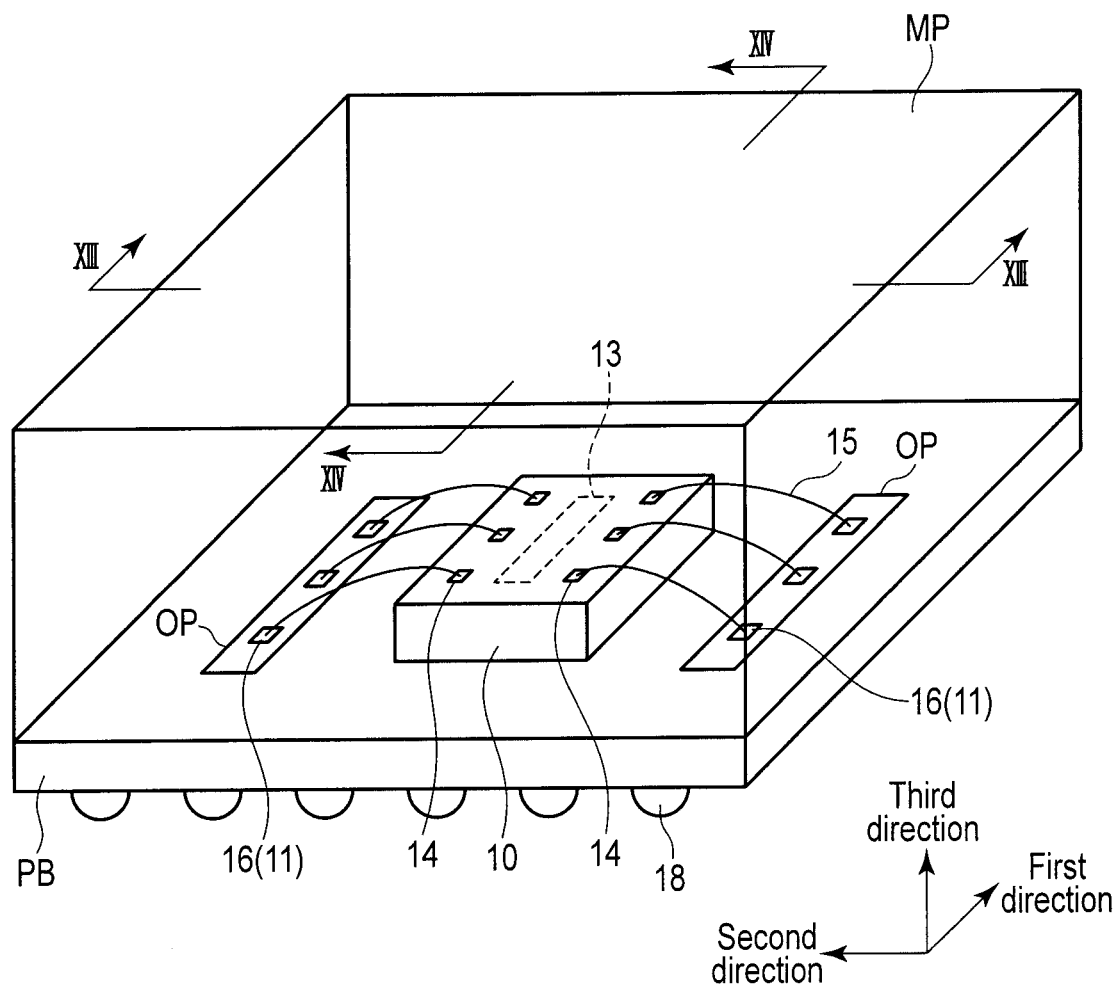
FIG. 12 is a perspective view of a fourth embodiment.

FIG. 12 is a perspective view of a fourth embodiment. FIG. 13 is a cross-sectional view taken along line XIII-XIII of FIG. 12. FIG. 14 is a cross-sectional view taken along line XIV-XIV of FIG. 12.

A semiconductor device according to the fourth embodiment is a modification of the semiconductor device of the third embodiment. The semiconductor device of the fourth embodiment differs from that of the third embodiment in that the former further comprises a metal cap MP as a package.

Magnetic shield layers 11 are provided on an inner surface of a metal cap MP.

This embodiment can also be modified in the same way as the third embodiment.

For instance, in this embodiment, the sealing member 17 may be omitted. Further, the conductive lines 16 on the printed board PB may be made to function as magnetic shield layers 11.

Further, as shown in FIGS. 15 and 16, the magnetic shield layer comprises a first magnetic layer 11A covering the lower surface of the MRAM chip 10, and a second magnetic layer 11B covering the upper and side surfaces of the MRAM chip 10. FIGS. 15 and 16 correspond to FIGS. 13 and 14, respectively.

Furthermore, as shown in FIGS. 17 and 18, the printed board PB may be formed like a box and the metal cap MP be formed like a plate. Also in this case, the first magnetic layer 11A is provided on the printed board PB, and the second magnetic layer 11B is provided on the inner (lower) surface of the metal cap MP. FIGS. 17 and 18 correspond to FIGS. 13 and 14, respectively.

Since the fourth embodiment is similar to the third embodiment in the other points, the elements of FIGS. 12 to 18 similar to those of FIGS. 7 to 11 are denoted by corresponding reference numbers, and no detailed description will be given thereof.

In the fourth embodiment, external magnetic fields can be blocked by the magnetic shield layer 11 so as not to enter the memory cell array area 13 of the MRAM chip 10. As a result, the operations (writing, reading and data storage) of the MRAM chip 10 can be reliably performed without the influence of the external magnetic fields.

(Fifth Embodiment)

Figure 19:
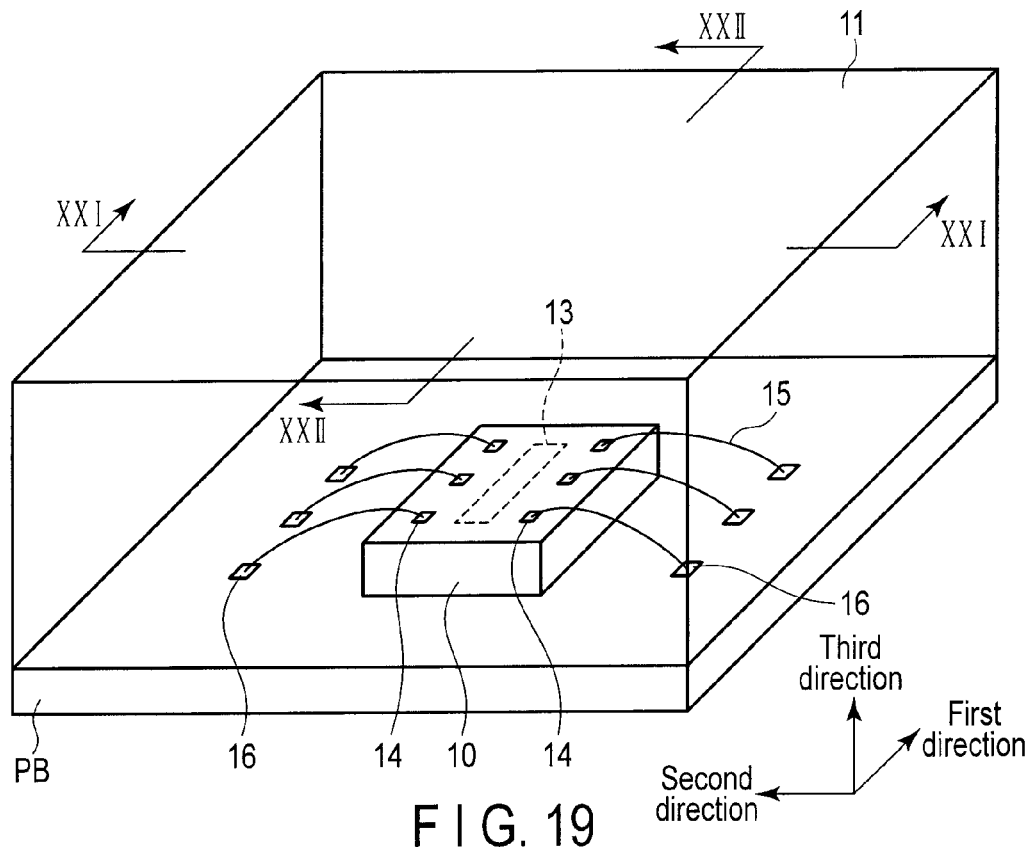
FIG. 19 is a perspective view of a fifth embodiment.
Figure 20:
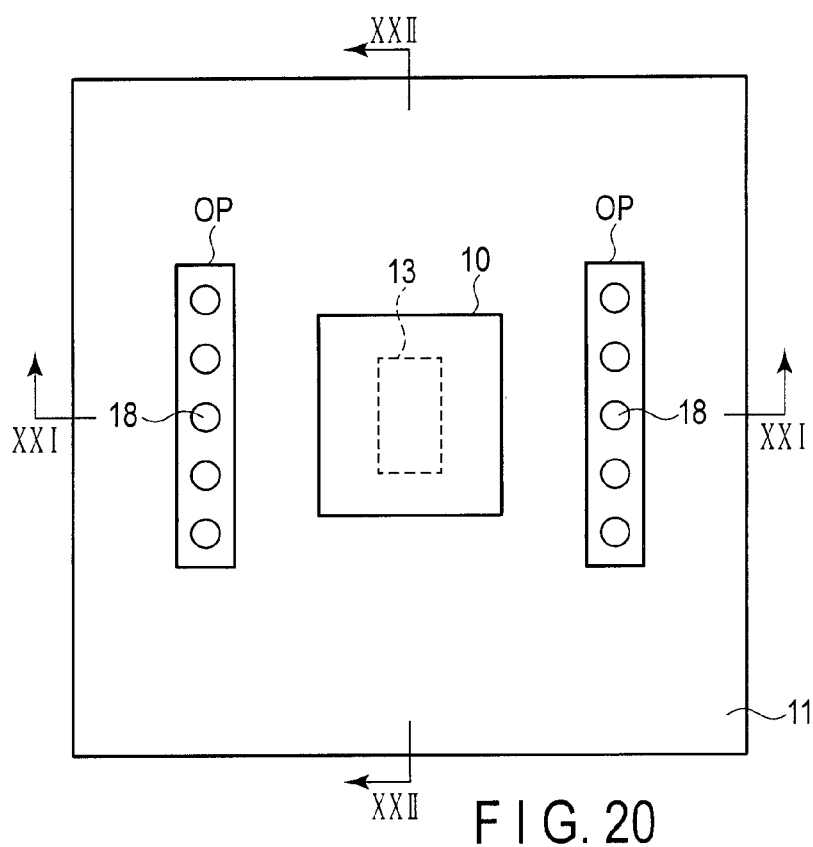
FIG. 20 is a plan view of the fifth embodiment.
Figure 21:
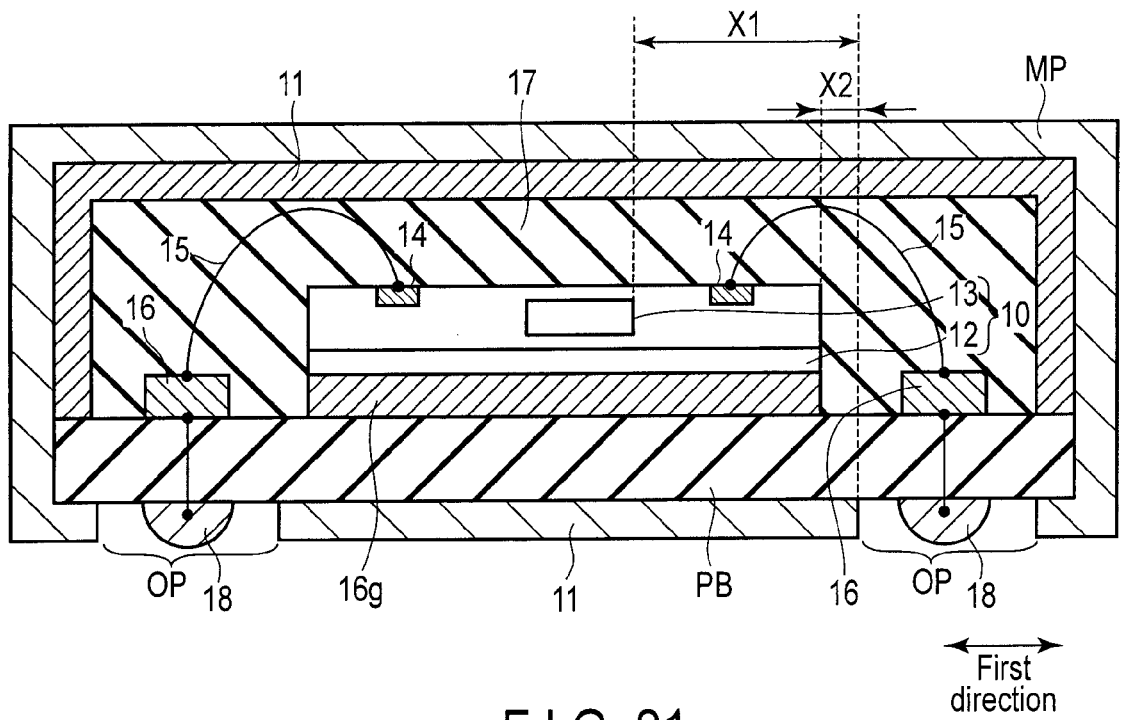
FIG. 21 is a cross-sectional view taken along line XXI-XXI of FIGS. 19 and 20.
Figure 22:
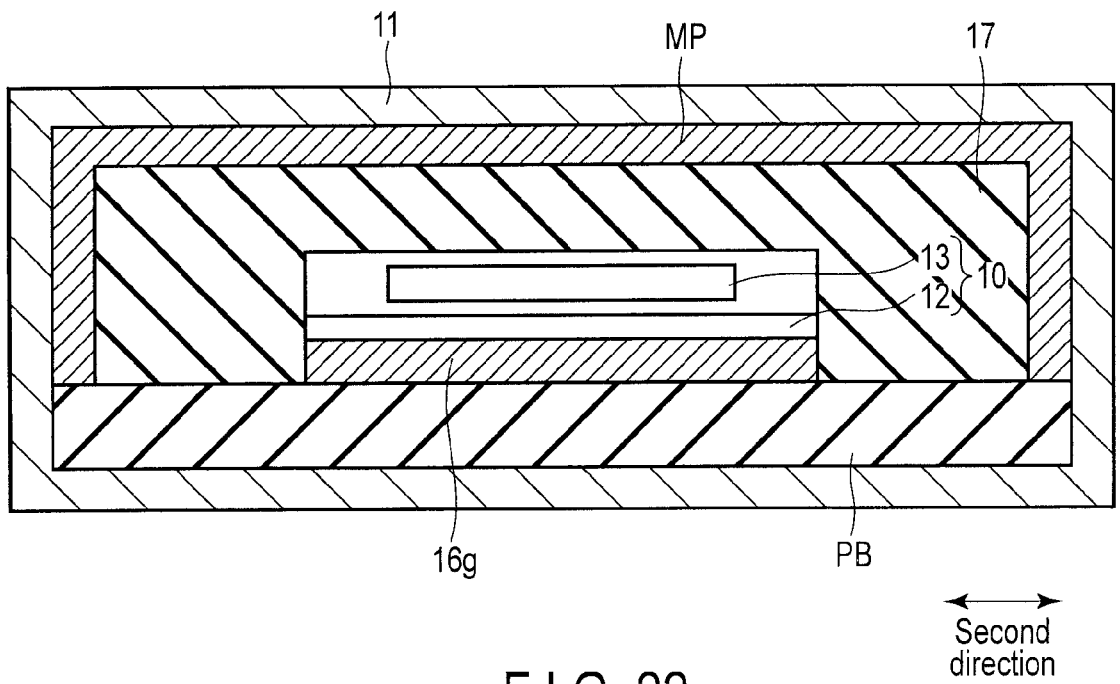
FIG. 22 is a cross-sectional view taken along line XXII-XXII of FIGS. 19 and 20.

FIG. 19 is a perspective view of a fifth embodiment. FIG. 20 is a plan view of the fifth embodiment. FIG. 21 is a cross-sectional view taken along line XXI-XXI of FIGS. 19 and 20. FIG. 22 is a cross-sectional view taken along line XXII-XXII of FIGS. 19 and 20.

A semiconductor device according to the fifth embodiment is a modification of the semiconductor device of the third embodiment. The semiconductor device of the fifth embodiment differs from that of the third embodiment in that the former further comprises a metal cap MP as a package.

A magnetic shield layer 11 is provided on an outer surface of the metal cap MP.

In this case, the magnetic shield layer 11 is also provided on the lower surface of the printed circuit PB, i.e., on the surface on which external terminals 18 are provided. The magnetic shield layer 11 has openings OP where the external terminals 18 are provided. The openings OP of the magnetic shield layer 11 are located outside the ends of the MRAM chip 10.

It is desirable to set, as long as possible, the distance X1 between each opening OP and the memory cell array area 13, and the distance X2 between each opening OP and the MRAM chip 10.

The MRAM chip 10 is provided on a conductive line 16g on the printed circuit PB. The conductive lines 16 and 16g may be formed of the same material. The conductive line 16g is used to apply, for example, a ground potential Vss to the semiconductor substrate 12 of the MRAM chip 10.

Since the fifth embodiment is similar to the third embodiment in the other points, the elements of FIGS. 19 to 22 similar to those of FIGS. 7 to 11 are denoted by corresponding reference numbers, and no detailed description will be given thereof.

In this embodiment, the sealing member 17 may be omitted. Further, the conductive lines 16 on the printed board PB may be made to function as magnetic shield layers 11.

In the fifth embodiment, external magnetic fields can be blocked by the magnetic shield layer 11 so as not to enter the memory cell array area 13 of the MRAM chip 10. As a result, the operations (writing, reading and data storage) of the MRAM chip 10 can be reliably performed without the influence of the external magnetic fields.

(Sixth Embodiment)

Figure 23:
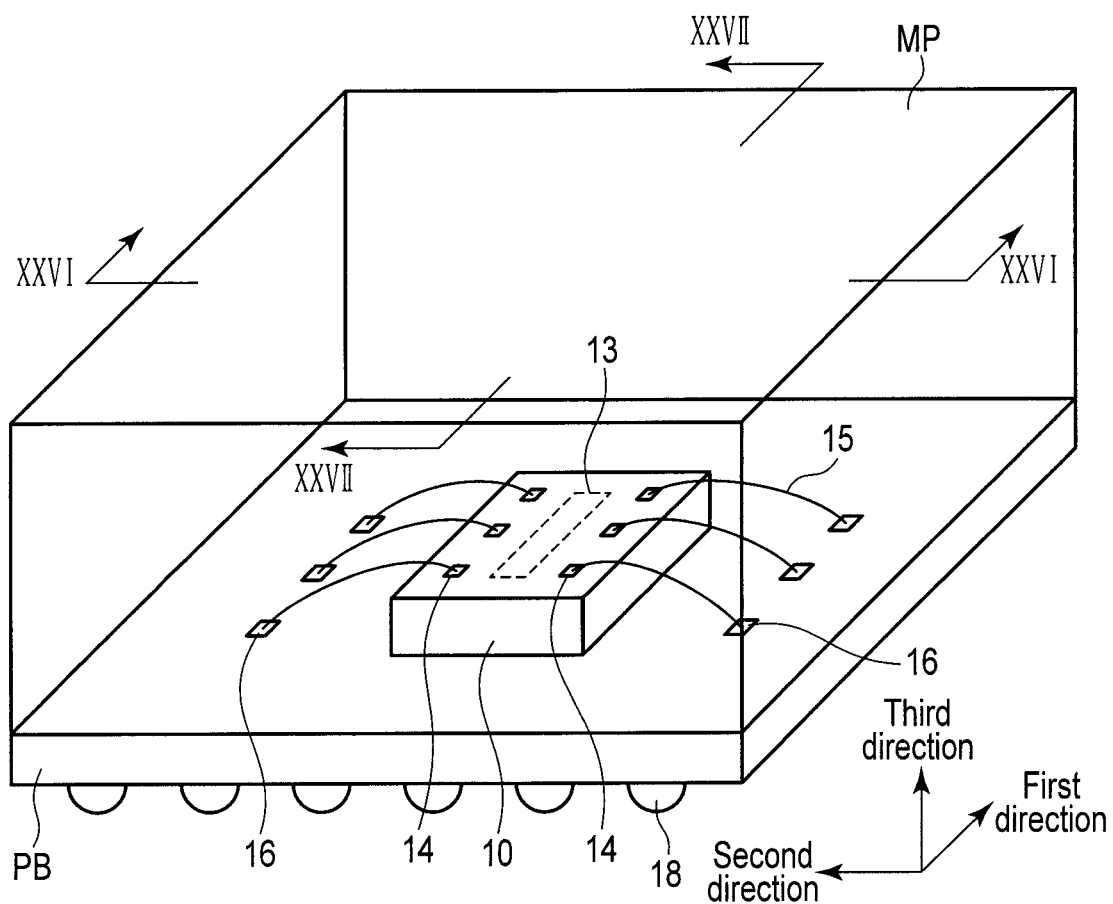
FIG. 23 is a perspective view of a sixth embodiment.
Figure 24:
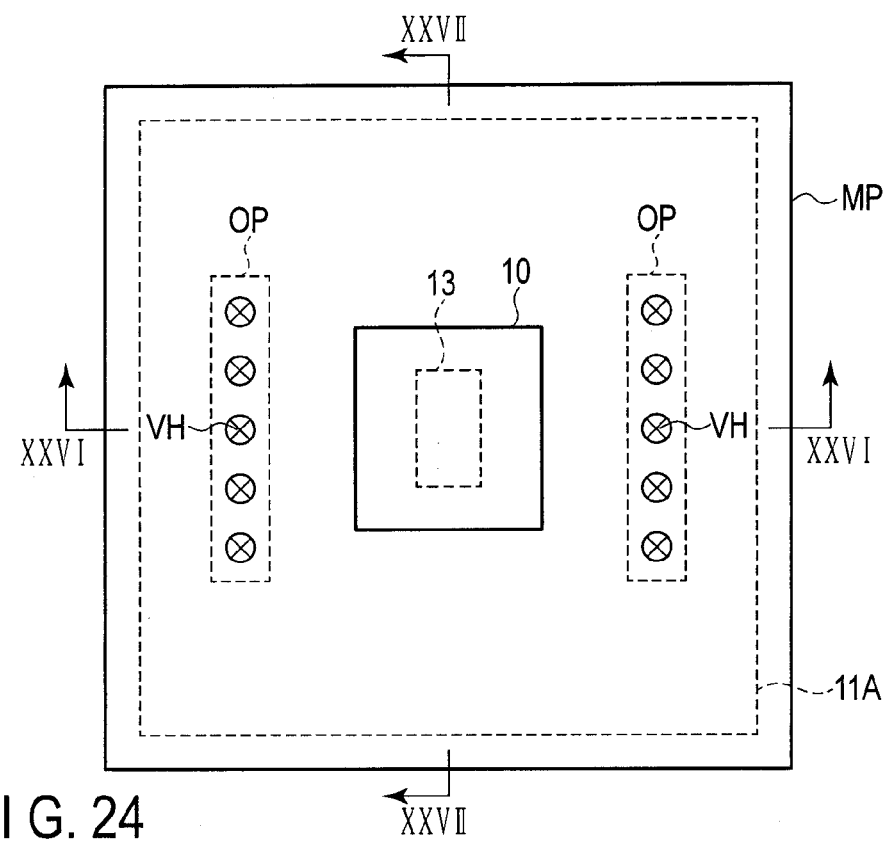
FIGS. 24 and 25 are plan views of the sixth embodiment.
Figure 25:
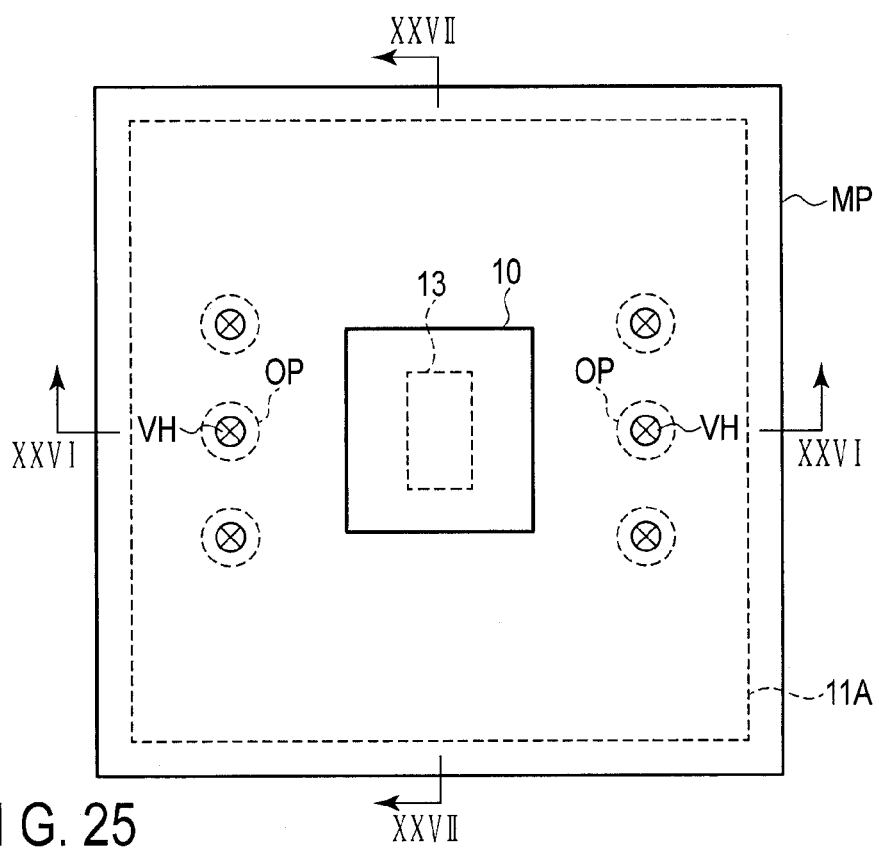

FIG. 23 is a perspective view of a sixth embodiment. FIGS. 24 and 25 are plan views of the sixth embodiment. FIG. 26 is a cross-sectional view taken along line XXVI-XXVI of FIGS. 23 to 25. FIG. 27 is a cross-sectional view taken along line XXVII-XXVII of FIGS. 23 to 25.

The sixth embodiment is a modification of the first modification (shown in FIGS. 15 and 16) of the fourth embodiment.

Compared to the first modification of the fourth embodiment, the sixth embodiment is characterized in that the printed board PB with a memory chip C is, for example, a multilayered glass epoxy substrate with a plurality of wiring layers, and a first magnetic layer 11A as a magnetic shield layer is provided in one of the plurality of wiring layers.

The MRAM chip 10 is provided on a conductive line 16g on the printed circuit PB. Namely, the semiconductor substrate 12 of the MRAM chip 10 is set to the ground potential Vss via the conductive line 16g.

The external terminals 14 of the MRAM chip 10 are electrically connected to the conductive lines 16 on the printed board PB by bonding wires 15. The conductive lines 17 are electrically connected to the external terminals 18 of the printed board PB via conductive vias VH.

First and second magnetic layers 11A and 11B as magnetic shield layers have a closed loop structure in a first cross section (see FIG. 27) that is perpendicular to the major surface of the semiconductor substrate 12 and is parallel to a circumferential direction. To form the closed loop structure, the second magnetic layer 11B covers the side surfaces of the printed board PB and contacts the first magnetic layer 11A.

Accordingly, the first and second magnetic layers 11A and 11B can prevent external magnetic fields from entering the memory cell array area 13 of the MRAM chip 10.

Further, the first magnetic layer 11A as a magnetic shield layer has openings (ends) OP in a second cross section (see FIG. 26) perpendicular to the first cross section and parallel to the major surface of the semiconductor substrate 12. It is desirable to set, as long as possible, the distance X1 between each opening OP and the memory cell array area 13, and the distance X2 between each opening OP and the MRAM chip 10.

The openings OP of the first magnetic layer 11A are where conductive vias VH are to be formed. Since the conductive vias VH are used to connect the external terminals 14 of the MRAM chip 10 to the external terminals 18 of the printed board PB, the openings OP are indispensable elements.

In order to set the distances X1 and X2 as long as possible, it is desirable to arrange the openings OP of the first magnetic layer 11A along edges of the printed board PB. As shown in FIG. 24, the openings OP may be formed in the shape of slits to arrange therein a plurality of conductive vias VH as shown in FIG. 25. Alternatively, the openings OP may be formed in the shape of holes (circular or rectangular holes) corresponding to the respective vias VH, as is shown in FIG. 25.

Since the sixth embodiment is similar to the fourth embodiment in the other points, the elements of FIGS. 23 to 27 similar to those of FIGS. 15 and 16 are denoted by corresponding reference numbers, and no detailed description will be given thereof.

In this embodiment, the sealing member 17 may be omitted.

Further, although in this embodiment, the MRAM chip 10 and the printed board PB are electrically connected by the bonding wires, flip bonding, or through silicon vias (TSV), etc., may be utilized for the electrical connection, instead of the bonding wires.

In the sixth embodiment, external magnetic fields can be prevented by the first and second magnetic layers 11A and 11B from entering the memory cell area 13 of the MRAM chip 10. As a result, the operations (writing, reading and data storage) of the MRAM chip 10 can be reliably performed without the influence of the external magnetic fields.

(Seventh Embodiment)

Figure 28:
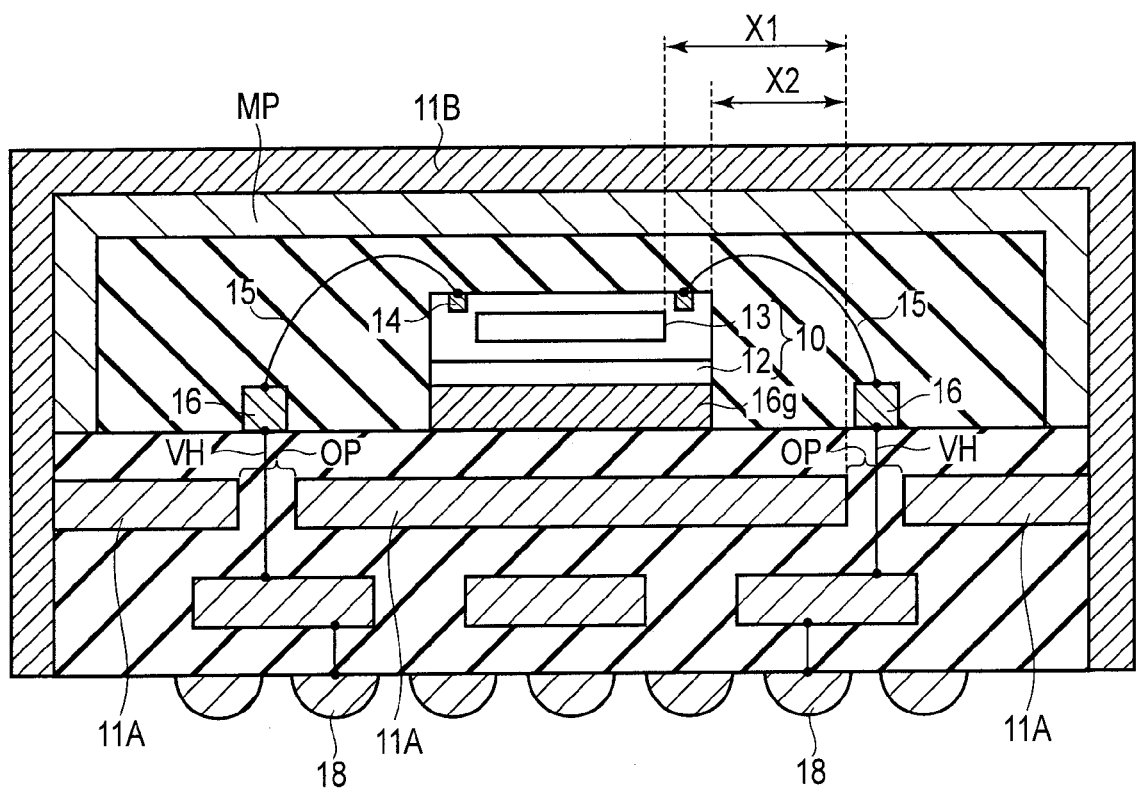

FIGS. 28 and 29 are cross-sectional views associated with a seventh embodiment.

A semiconductor device according to the seventh embodiment is a modification of the semiconductor device of the sixth embodiment. FIGS. 28 and 29 correspond to FIGS. 26 and 27 showing the sixth embodiment. Namely, FIGS. 23 to 25 can be also used as figures associated with the seventh embodiment.

The semiconductor device of the seventh embodiment differs from that of the sixth embodiment in that the positional relationship between the metal cap MP and the second magnetic layer 11B is opposite. More specifically, the second magnetic layer 11B as the magnetic shield layer is provided on the outer surface of the metal cap MP.

In this case, the metal cap MP is provided on the upper surface of the printed board PB, and not on the side surfaces thereof, in order to make the first and second magnetic layers 11A and 11B contact each other. The second magnetic layer 11B covers the side surfaces of the printed board PB and contacts the first magnetic layer 11A.

Since the seventh embodiment is similar to the sixth embodiment in the other points, the elements of FIGS. 28 and 29 similar to those of FIGS. 23 to 27 are denoted by corresponding reference numbers, and no detailed description will be given thereof.

In the seventh embodiment, the sealing member 17 may be omitted.

In the seventh embodiment, external magnetic fields can be prevented by the first and second magnetic layers 11A and 11B from entering the memory cell area 13 of the MRAM chip 10. As a result, the operations (writing, reading and data storage) of the MRAM chip 10 can be reliably performed without the influence of the external magnetic fields.

(Others)

In FIGS. 10, 11, 15, 16 and 26 to 29, the first and second magnetic layers 11A and 11B may be formed of the same material or different materials. However, in view of the function as an external magnetic field shield, it is desirable that the first and second magnetic layers 11A and 11B should have the same magnetic shield effect.

To this end, it is desirable that the product (Ms1×t1) of the saturated magnetization Ms1 of the first magnetic layer 11A and the thickness t1 thereof should be substantially equal to the product (Ms2×t2) of the saturated magnetization Ms2 of the second magnetic layer 11B and the thickness t2 thereof. By virtue of this structure, the closed magnetic path by the first and second magnetic layers 11A and 11B is strengthened, thereby preventing external magnetic fields from entering the MRAM chip through the coupled portion of the first and second magnetic layers 11A and 11B.

(Manufacturing Method)

A description will now be given of a manufacturing method example employed in the above-described first to seventh embodiments.

Figure 30:
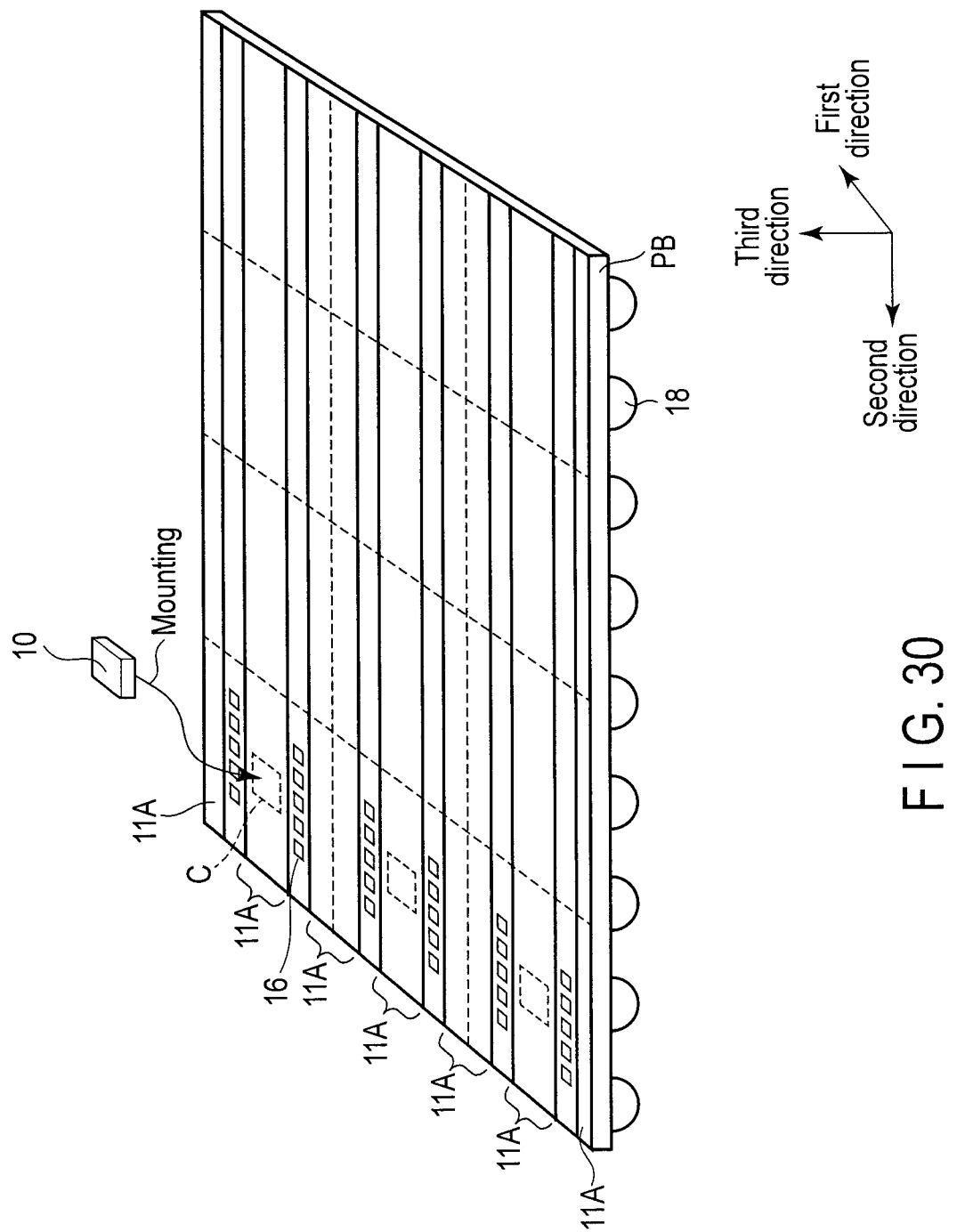
FIG. 30 is a perspective view of an embodiment of a manufacturing method.

Firstly, as shown in FIG. 30, external terminals 18 are formed on the reverse surface of the printed board PB, and first magnetic layers (formed of, for example, metal foils) 11A and conductive lines 16 are formed on the obverse surface of a printed board PB.

In this method, the first magnetic layers 11A are formed on the obverse surface of the printed board PB. However, they may be formed on the reverse surface of the printed board PB. Further, if the printed board PB comprises a plurality of wiring layers, the first magnetic layers 11A may be formed in one of the plurality of wiring layers.

Subsequently, MRAM chips 10 are mounted on chip mounting areas C of the printed board PB. After that, as shown in FIGS. 31 and 32, the external terminals 14 of each MRAM chip 10 are electrically connected to the corresponding conductive lines 16 of the printed board PB by bonding wires 15.

Thereafter, as shown in FIGS. 33 and 34, resin layers as sealing members 17 are formed on the printed board PB. More specifically, the sealing members 17 are formed on the upper and side surfaces of the respective MRAM chips 10.

Figure 36:
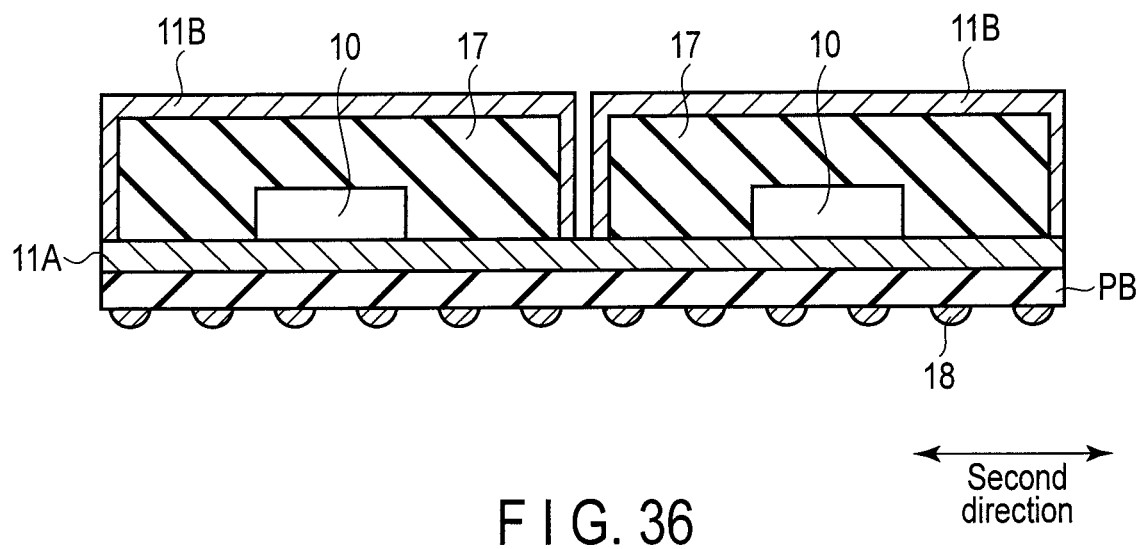
FIG. 36 is a cross-sectional view taken along line XXXVI-XXXVI of FIG. 35.

After that, as shown in FIGS. 35 and 36, second magnetic layers 11B are formed on the resin layers as the sealing members 17 such that they are in contact with the first magnetic layers 11A.

Figure 37:
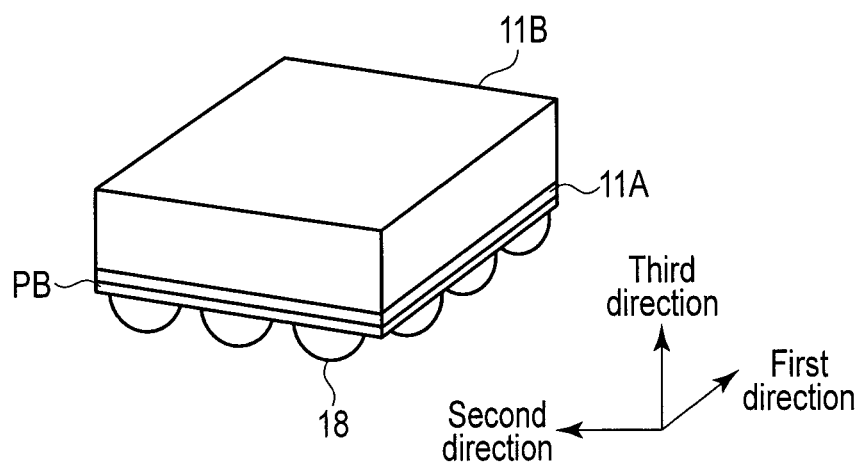
FIG. 37 is a perspective view of the embodiment of the manufacturing method.

Lastly, as shown in FIG. 37, each BGA package with an MRAM chip 10 is formed by cutting the printed board PB.

(Example of an Area in which a Magnetoresistive Element is Provided)

A description will be given of an example of an area in which a magnetoresistive element is provided.

Figure 38:
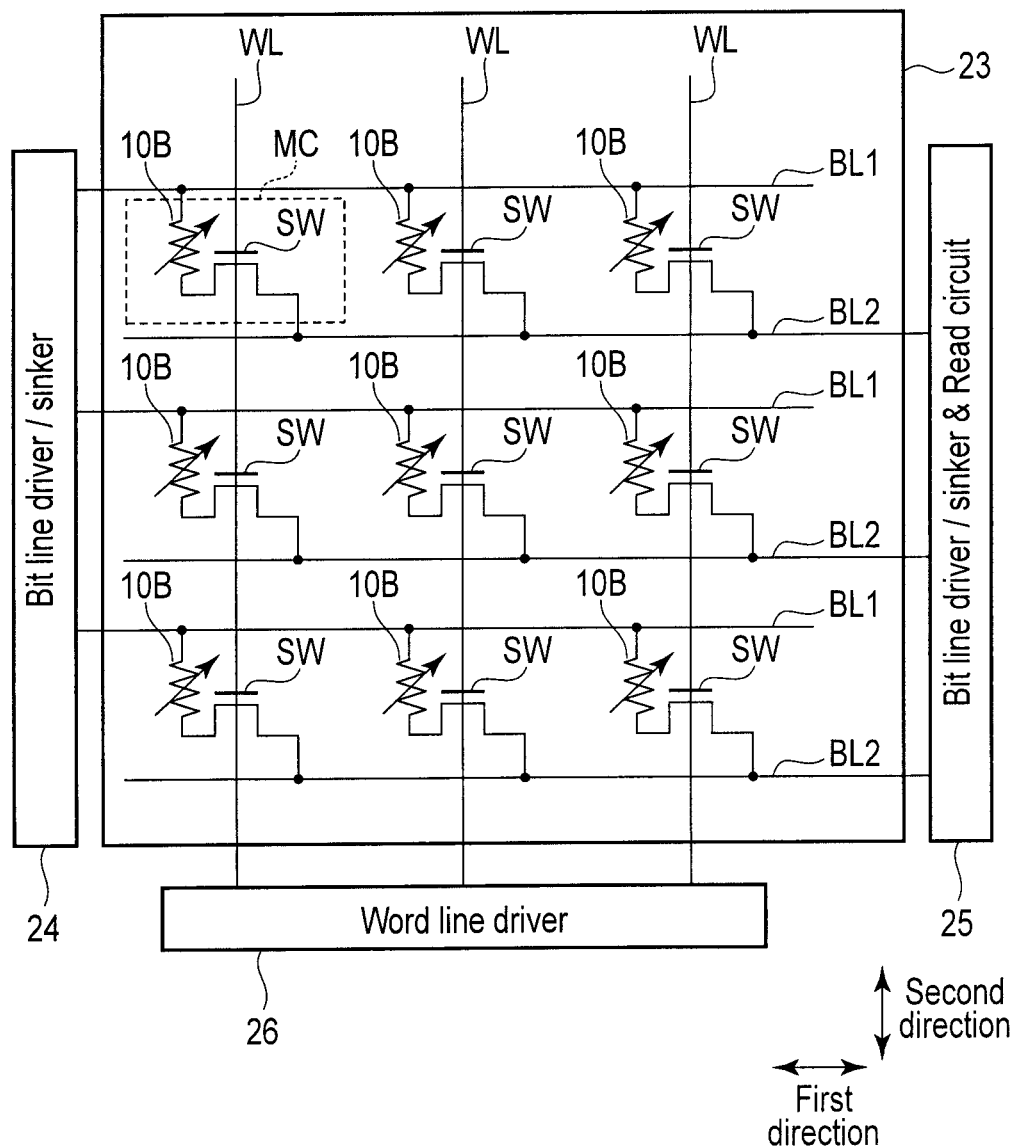
FIG. 38 is a circuit diagram showing a circuit including a magnetoresistive element.

FIG. 38 shows an example of an equivalent circuit in a memory cell array area.

A memory cell array 23 comprises a plurality of memory cells MC arranged in an array. Each memory cell includes one magnetoresistive element 10B and one selective transistor (FET) SW.

The magnetoresistive element 10B and the selective transistor SW are connected in series. An end of the series circuit is connected to a first bit line BL1, and the other end of the same is connected to a second bit line BL2. The control terminal (gate terminal) of the selective transistor SW is connected to a word line WL.

The first bit line BL1 extends in a first direction, and has its one end connected to a bit line driver/sinker 24. The second bit line BL2 extends in a second direction, and has its one end connected to a bit line driver/sinker & read circuit 25.

However, the circuit may be modified such that the first bit line BL1 is connected to the bit line driver/sinker & read circuit 25, and the second bit line BL2 is connected to the bit line driver/sinker 24.

Further, the positions of the bit line driver/sinker 24 and the bit line driver/sinker & read circuit 25 may be changed to each other, or be on the same side.

Each word line WL extends in the second direction and has its one end connected to a word line driver 26.

FIG. 39 shows a memory cell example.

A selective transistor SW is located in an active area AA in a semiconductor substrate 27. The active area AA is surrounded by an element isolating layer 28. In this example, the element isolating layer 28 has a shallow trench isolation (STI) structure.

The selective transistor SW comprises source and drain diffusion layers 29a and 29b in the semiconductor substrate 27, a gate insulation layer 30 placed on the channel between the source and drain diffusion layers, and a gate electrode 31 on the gate insulation layer 30. The gate electrode 31 functions as a word line WL.

An interlayer insulation layer 32 covers the selective transistor SW. The interlayer insulation layer 32 has a flat upper surface, on which a lower electrode 33 is provided. The lower electrode 33 is connected to the source/drain diffusion layer 29b of the selective transistor SW via a contact plug 34.

A magnetoresistive element 10B is provided on the lower electrode 33. An upper electrode 35 is provided on the magnetoresistive element 10B. The upper electrode 35 functions as, for example, a hard mask when the magnetoresistive element 10B is processed.

An interlayer insulation layer 36 is provided on the interlayer insulation layer 32 and covers the magnetoresistive element 10B. The interlayer insulation layer 36 has a flat upper surface, on which the first and second bit lines BL1 and BL2 are provided. The first bit line BL1 is connected to the upper electrode 35. The second bit line BL2 is connected to the source/drain diffusion layer 29a of the selective transistor SW via a contact plug 37.

Although the embodiments are directed to semiconductor devices provided with MRAM chips, the above-described basic idea is also applicable to other types of semiconductor chips (such as a CMOS sensor, an MEMO sensor and a magnetic sensor) in which a problem due to the influence of external magnetic fields may be raised.

(Conclusion)

The above embodiments can prevent external magnetic fields entering in the MRAM chips.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
an MRAM chip including a semiconductor substrate and a memory cell array area comprising magnetoresistive elements which are provided on the semiconductor substrate, the MRAM chip including a first side surface and a second side surface facing the first side surface; and
a magnetic shield layer separated from the MRAM chip and surrounding the memory cell array area in a circumferential direction of the MRAM chip, the magnetic shield layer comprising a first opening corresponding to the first side surface of the MRAM chip and a second opening corresponding to the second side surface of the MRAM chip, and the magnetic shield layer having a closed magnetic path.

2. The device of claim 1, wherein the magnetic shield layer has a closed loop structure in a first cross section which is perpendicular to a surface of the semiconductor substrate and parallel to the circumferential direction.

3. The device of claim 2, wherein the magnetoresistive elements have magnetizations which are parallel to the first cross section.

4. The device of claim 2, wherein the magnetic shield layer has an end portion in a second cross section which is perpendicular to the first cross section and parallel to the surface of the semiconductor substrate.

5. The device of claim 4, wherein the end portion of the magnetic shield layer is provided outside an end portion of the MRAM chip in the second cross section.

6. The device of claim 1, wherein the magnetic shield layer functions as a package of the MRAM chip.

7. The device of claim 1, further comprising a circuit board on which the MRAM chip is mounted.

8. The device of claim 7, wherein the magnetic shield layer comprises a first magnetic layer between a lower surface of the MRAM chip and the circuit board, and a second magnetic layer covering an upper surface and a side surface of the MRAM chip.

9. The device of claim 8, wherein
the first magnetic layer has an opening in which a conductive line is provided, the conductive line being connected to an external terminal of the MRAM chip; and
the opening is provided outside an end portion of the MRAM chip in a direction which is parallel to a surface of the semiconductor substrate.

10. The device of claim 8, further comprising a resin covering the upper surface and the side surface of the MRAM chip,
wherein the second magnetic layer is provided on the resin.

11. The device of claim 7, further comprising a package on the circuit board, the package covering the upper surface and the side surface of the MRAM chip,
wherein the magnetic shield layer contacts the package.

12. The device of claim 7, wherein
the circuit board comprises wiring layers; and
the magnetic shield layer is provided in one of the wiring layers.

13. The device of claim 1, further comprising:
another MRAM chip including a semiconductor substrate and a memory cell array area comprising magnetoresistive elements which are provided on the semiconductor substrate, the another MRAM chip including a first side surface and a second side surface facing the first side surface; and
another magnetic shield layer separated from the another MRAM chip and surrounding the memory cell array area in a circumferential direction of the another MRAM chip, the another magnetic shield layer comprising a first opening corresponding to the first side surface of the another MRAM chip and a second opening corresponding to the second side surface of the another MRAM chip, and the another magnetic shield layer having a closed magnetic path.

14. A method of manufacturing a semiconductor device, the method comprising:
forming a MRAM chip including a semiconductor substrate and a memory cell array area comprising magnetoresistive elements which are provided on the semiconductor substrate;
mounting the MRAM chip on a first magnetic layer of a circuit board;
forming a second magnetic layer on the circuit board, the second magnetic layer covering an upper surface and a side surface of the MRAM chip; and
forming a magnetic shield layer surrounding the memory cell array area in a circumferential direction of the MRAM chip and having a closed magnetic path by the first and second magnetic layers.

15. The method of claim 14, wherein the magnetic shield layer has a closed loop structure in a first cross section which is perpendicular to a surface of the semiconductor substrate and parallel to the circumferential direction.

16. The method of claim 15, wherein the magnetic shield layer has an end portion in a second cross section which is perpendicular to the first cross section and parallel to the surface of the semiconductor substrate.

17. The method of claim 16, wherein the end portion of the magnetic shield layer is provided outside an end portion of the MRAM chip in the second cross section.

18. The method of claim 13, wherein the magnetoresistive elements have magnetizations which are parallel to the first cross section.

19. The method of claim 14, wherein the magnetic shield layer functions as a package of the MRAM chip.

20. The method of claim 14, further comprising forming a resin layer covering the upper surface and the side surface of the MRAM chip.

21. The method of claim 20, wherein the second magnetic layer is formed on the resin layer.

* * * * *